United States Patent
Paulöhrl et al.

(10) Patent No.: US 12,210,284 B2
(45) Date of Patent: Jan. 28, 2025

(54) PHOTOSENSITIVE COMPOSITION

(71) Applicant: XSYS Germany GmbH, Willstätt (DE)

(72) Inventors: Thomas Paulöhrl, Stuttgart (DE); Christian Pietsch, Stuttgart (DE)

(73) Assignee: XSYS GERMANY GMBH, Willstätt (DE)

( * ) Notice: Subject to any disclaimer, the term of this patent is extended or adjusted under 35 U.S.C. 154(b) by 15 days.

(21) Appl. No.: 17/523,070

(22) Filed: Nov. 10, 2021

(65) Prior Publication Data

US 2022/0171288 A1   Jun. 2, 2022

(30) Foreign Application Priority Data

Nov. 27, 2020   (NL) .................................... 2027002

(51) Int. Cl.
| | |
|---|---|
| *G03F 7/004* | (2006.01) |
| *G03F 7/027* | (2006.01) |
| *G03F 7/028* | (2006.01) |
| *G03F 7/039* | (2006.01) |
| *G03F 7/20* | (2006.01) |
| *G03F 7/32* | (2006.01) |

(52) U.S. Cl.
CPC ............ *G03F 7/027* (2013.01); *G03F 7/0045* (2013.01); *G03F 7/028* (2013.01); *G03F 7/0392* (2013.01); *G03F 7/20* (2013.01); *G03F 7/322* (2013.01)

(58) Field of Classification Search
CPC ........ G03F 7/0045; G03F 7/027; G03F 7/028; G03F 7/20; G03F 7/322; G03F 7/033
See application file for complete search history.

(56) References Cited

U.S. PATENT DOCUMENTS

| | | | |
|---|---|---|---|
| 10,300,690 B2 | 5/2019 | Landa et al. | |
| 2008/0257185 A1* | 10/2008 | Becker | G03F 7/40 |
| | | | 101/401.1 |
| 2015/0075399 A1* | 3/2015 | Ushijima | B41N 1/06 |
| | | | 525/221 |
| 2019/0391492 A1 | 12/2019 | Pietsch et al. | |

FOREIGN PATENT DOCUMENTS

| | | | | |
|---|---|---|---|---|
| EP | 0109773 | A2 | 5/1984 | |
| EP | 2881793 | A1 | 6/2015 | |
| JP | S62246047 | A | 10/1987 | |
| JP | 2514315 | B2 * | 7/1996 | ............. G03F 7/033 |

(Continued)

OTHER PUBLICATIONS https://scifinder-n.cas.org/searchDetail/substance/652d4dd0ced3ff20e23acabd/substanceDetailsScifinder entry for CAS Registry No. 1565823-54-2 (Year: 2023).*

(Continued)

*Primary Examiner* — Sean M DeGuire
*Assistant Examiner* — Alexander N. Lee
(74) *Attorney, Agent, or Firm* — KDW Firm PLLC

(57) ABSTRACT

A photosensitive composition of a developable relief precursor includes at least one ethylenically unsaturated monomer as component E, at least one photoinitiator or photoinitiator system as component P, at least one water soluble and/or water dispersible binder as component B, and optionally, one or more additives as component A. Component E includes at least one ionic group and component E is present in an amount of 0.1 to 30 wt %, based on the total weight of the photosensitive composition.

17 Claims, 2 Drawing Sheets

(56) References Cited

FOREIGN PATENT DOCUMENTS

| | | | | |
|---|---|---|---|---|
| JP | 2003302756 A | * | 10/2003 | |
| JP | 2012045801 A | * | 3/2012 | ............... B41C 1/05 |
| JP | 5158506 B2 | | 3/2013 | |
| WO | WO-2018141644 A1 | * | 8/2018 | .............. C08L 31/04 |

OTHER PUBLICATIONS

Peter Kasák, Zuzana Kroneková, Igor Krupa, Igor Lacík, Zwitterionic hydrogels crosslinked with novel zwitterionic crosslinkers: Synthesis and characterization, Polymer, vol. 52, Issue 14, pp. 3011-3020, 2011 (Year: 2011).*

Search Report and Written Opinion for NL 2027002, mailed Aug. 12, 2021, ten (10) pages.

* cited by examiner

PHOTOSENSITIVE COMPOSITION

This application claims priority to Netherlands Patent Application No. NL 2027002, filed Nov. 27, 2020, the entirety of which is incorporated by reference herein.

TECHNICAL FIELD

The field of the invention relates to a photosensitive composition of a developable relief precursor and the resulting relief structures used for flexographic, pad printing and letterpress printing.

BACKGROUND

In the field of pad, flexographic and letterpress printing, developable printing plates, also called relief precursors, are produced and developed in order to create relief structures with a desired patterned surface. The patterned surface is then covered with ink and pressed against a printing substrate. In this way, one can transfer ink and create a desired image on the printing substrate such as a packaging, a label, paper rolls, polymer films, cardboards and many other products.

Relief precursors typically comprise a photosensitive composition in which the components crosslink or cure when they are exposed to electromagnetic radiation. During the exposure, the precursor is exposed to the electromagnetic radiation in selected areas. It is in those areas that the photosensitive composition polymerizes, forms crosslinks and cures to create a relief profile which can be used to print with. This exposure is usually done conventionally or digitally. In the conventional way, relief structures are produced by placement of a photographic mask on or over the relief precursor, followed by exposure through the photographic mask. This photographic mask has transparent regions which determine the selected areas of the precursor to be cured. The electromagnetic radiation passes the transparent regions and cures the photosensitive composition underneath. In the digital way, a mask is produced in situ directly on the relief precursor by, for example, using a laser ablatable mask layer wherein a motif is created with a laser light source. Additionally, other known methods such as thermographic writing can be used to create a cured pattern.

After the curing or polymerization and crosslinking, the exposed precursor is treated or washed using a suitable solvent or solvent mixture, with the unexposed, uncured or unpolymerized regions of the relief-forming layer being dissolved, while the exposed, polymerized and crosslinked regions are retained and form the relief of the printing plate. It is usually this treating or washing step that is, if not the most, time consuming step in the whole manufacturing process of the relief structure.

Several developments and changes have been made regarding the relief precursors and the components therein, trying to address the desired and more demanding printing needs such as the capability to print on new, different and more challenging printing substrates, printing with higher speeds, printing with a better printing quality and thereby achieving sharper images or images with brighter colors.

However, despite all these developments, there is still a need to further improve not only the relief precursors themselves but also the method of producing said precursors and the method to manufacture the resulting relief structures since several problems are yet to be resolved and several additional aspects are to be improved.

Existing relief precursors typically comprise traces of organic halogens such as chlorine, bromine and iodine that are harmful chemicals which negatively affect the environment when they are released from the precursor. When working with the relief precursors, said organic halogen components get transferred to the surroundings. Further, the development of the relief precursor is usually done with aid from a developing liquid, also known as a washing liquid. During the development, the chemicals find their way into the developing liquid and thereby risk of ending up in the environment when the liquid is disposed.

Further, when one is working with the relief precursor prior to its development, it is desired to have a precursor that is mechanically stable while still having enough durability and flexibility. Existing precursors often result in relief structures showing undesirably features after development. Those relief structures suffer from a decrease in mechanical quality and often show cracks or other deformities, especially when one is working or printing with the relief structures for a longer period of time. Additionally, the side edges of the relief precursor and relief structure have the tendency to curl up which is rather cumbersome and not handy to work with.

SUMMARY OF THE INVENTION

It is an object of the present invention to at least solve or partially solve the above mentioned problems and provide the art with an improved relief precursor, more in particular with a photosensitive composition of a relief precursor which at least partially solves the above mentioned problems and further improves additional aspects. In particular, the invention aims for achieving shorter manufacturing times of the relief structures, improved printing quality, a higher predictability, reliability and precision of the patterned surfaces as well as a higher durability of a relief structure and achieving a higher resolution of the printed images.

This object is achieved by the invention as presented in claim 1. Namely, the inventor has found that the above object is achieved with a photosensitive composition of a developable relief precursor comprising: at least one ethylenically unsaturated monomer as component E, at least one photoinitiator or photoinitiator system as component P, at least one water soluble and/or water dispersible binder as component B and optionally, one or more additives as component A.

And wherein component E comprises at least one ionic group and component E is present in an amount of 0.5 to 30 wt %, based on the total weight of the photosensitive composition.

By including an ionic group into the ethylenically unsaturated monomer, the polarity of the photosensitive composition is increased and charges are brought into the polymer chain and/or into the polymer network, formed with the ethylenically unsaturated monomer as building blocks together with the water soluble and/or water dispersible binder and optional additives. The formation of the polymer chain and/or network comprising the ethylenically unsaturated monomer is initiated by the photoinitiator or photoinitiator system present in the photosensitive composition according to the invention, in particular when the composition is exposed to electromagnetic radiation. This formation of the polymer chain and/or network cause the photosensitive composition to cure and crosslink, thereby creating a relief profile. By using the ethylenically unsaturated monomers carrying ionic groups as described herein less or no harmful chemicals are released into the surroundings, such as for example the environment and developing liquid, in particular when said monomers are formed via esterification, wherein acrylic acids are preferably used.

Further, the time-consuming step of removing the unexposed areas is shortened. Also, the photosensitive composition according to the invention increases the flexibility of the relief precursor and relief structure and reduces the undesired and cumbersome "curl-up phenomena".

Regarding component E, it is preferred that the ethylenically unsaturated monomers are present in an amount of 0.5 to 20 wt %, based on the total weight of the photosensitive composition. It has been found that this wt % concentration achieves optimal results, since the concentration of component E, influences, among other things, the swelling capacity, water solubility and flexibility of the photosensitive composition, wherein higher concentrations tend to increase the water solubility of not only the unexposed regions of the photosensitive composition but also the exposed regions. The water solubility of the cured photosensitive composition, in particular in the exposed areas may not be too high since then also the cured photosensitive composition may get washed away during the development of the relief precursor. Additionally, higher concentrations may cause the relief structure to swell to an undesired extend. This may impact the precision and reliability printing capabilities of the relief structure, in particular when one is printing with water-based ink.

In a preferred embodiment, component E has a solubility in water equal or above 200 g/l, preferably in the range of 200 to 1500 g/l more preferably 500 to 1500 g/l, at 20° C., 1 atm and in water with a pH of 7, in order to achieve shorter washing times and thereby resulting in an overall shorter development process or method of manufacturing of the relief structure.

In a certain embodiment, it is favored that, component E has a molecular weight in the range of 100 to 1000 g/mol, more preferably in the range of 110 to 500 g/mol, even more preferably 120 to 300 g/mol. These ranges are preferred, in order to assist in achieving desired features such as a shorter washing time so that the unexposed regions of the relief precursor can be removed more quickly. Additionally, these ranges cause the resulting polymer chains and/or network to have a desired amount of flexibility, which improves the properties of the relief precursor and relief structure.

In an embodiment, component E comprises at least one of the following: an acrylate group, a methacrylate group, an acrylamide group, a vinyl group, a vinyl ether group or combinations thereof. These groups are of particular preference since they achieve the optimum results in regard to the polymerization and crosslinking of the photosensitive composition and show decent compatibility with the other components present in the photosensitive composition.

In an embodiment, component E has a vapor pressure below 50 hPa at 25° C. These vapor pressures should not be too high due to environmental reasons and reasons regarding the ease, comfort and health of the operator working with either one of the components, the photosensitive composition, the relief precursor and relief structure.

In a particular embodiment, component E has an AOX value lower than 2600 mg/L, preferable lower than 1000 mg/L, more preferably lower 100 mg/L. The AOX value is determined according to the 'DIN EN ISO 9562' norm and indicates adsorbable organic halides, hence the name AOX. By selecting the above ranges, one reduces the risk of the harmful chemicals transferring into the surroundings, developing liquid and environment.

In a particular embodiment, component E has an EOX value lower than 2000 mg/kg, preferably lower than 200 mg/kg, and more preferably lower than 50 mg/kg. The EOX value is determined according to the 'DIN 38414-17' norm using i-hexane as solvent. This value indicates extractable organic halogens, hence the name EOX. By selecting the above ranges, one reduces the risk of the harmful chemicals transferring into the surroundings, developing liquid and environment.

Preferably, the at least one ionic group comprised in component E is selected from the group: a quaternary ammonium group, a carboxylate group, a sulfonate group, a sulfonium group, a phosphonium group and combinations thereof. The groups have been found to assist in achieving the desirable effects as described earlier and have preference due their compatibility with the other components in the photosensitive composition.

In an aspect of the invention, component E is a quaternized aminofunctional monomer. Such a monomer acts as a cationic detergent and can reduce undesired phenomena such as siltation when a relief precursor is washed during a development process.

In another aspect of the invention, a photosensitive composition is provided, further comprising an ethylenically unsaturated compound as component EM, wherein said component EM does not carry an ionic group. The presence of such a component in combination with the rest of the components in the photosensitive composition enhance desired washing and mechanical durability properties of the relief precursor. Preferably, component EM is present in an amount of 0.5 to 50 wt %, preferably in 0.9-40 wt %, more preferably 1-30 wt %, based on the total weight of the photosensitive composition and wherein the ratio of EM/E is between 0.1 and 10, more preferably 0.15 and 8, even more preferably between 0.2 and 5. Such ratios are found to achieve the aforementioned desired results in washing and mechanical durability properties of the relief precursor.

Regarding component P, it is preferred to select said component P from the group comprising: a benzyl ketal, hydroxy ketone, an amino ketone, an acyl phosphine oxide, a bis acyl phosphine oxide, a thioxanthone, an anthraquinone, a coumarine, a hexaarylbisimidazole, a benzophenone, and combinations thereof. These groups are of preference since they form a suitable degree of radical forming and allow curing at low irradiance, preferably between 16-20 Watts/cm$^2$ although lower ranges may be possible.

Further, component P may be a photo initiator system that further comprises a co-initiator, wherein said co-initiator is selected from the group comprising: an amine, a thiol, a thioether, an amino alcohol, a thioether amine and combinations thereof.

Regarding component B, the water soluble and/or water dispersible binder. Preferably, this binder is crosslinkable with the polymer chains formed by component E, the ethylenically the ethylenically unsaturated monomer and/or other additives. These binders can be polymers that may be linear, branched, star-shaped or dendritic and can be present both as homopolymers, statistical copolymers, block copolymers or alternating copolymers. The polymers mentioned are very often provided with functional groups which either increase the solubility and/or can participate in crosslinking reactions. These groups include, for example, carboxy, SO3, OH, thiol, ethylenically unsaturated (meth) acrylate, epoxy groups and any combination thereof.

Preferably, component B is selected from the group comprising: a polyvinyl alcohol, a polyvinyl acetate, a partially hydrolyzed polyvinyl acetate, a functionalized polyvinyl alcohol, a functionalized polyvinyl acetate, a functionalized partially hydrolyzed polyvinyl acetate, a polyvinyl acetal, a copolymer of polyvinyl acetate and at least one other monomer, a polyvinyl acetate polymer or copolymer with at least one grafted unit, polyurethanes, polyacrylates, polyamides, or combinations thereof. Preferably, the functionalized polyvinyl alcohol and/or functionalized partially or non-hydrolyzed polyvinyl acetate are functionalized with ethylenically unsaturated groups, and/or the at least one other monomer in the copolymer of polyvinyl acetate is ethylene, and/or the at least one grafted unit of the polyvinyl acetate polymer or copolymer is polyethylene glycol.

Regarding component A, the photosensitive composition may comprise one or more additives which are known to a skilled artisan and of which examples are given further in the description.

Further, according to the invention there is provided a developable relief precursor comprising: a dimensionally stable carrier layer as layer L1, at least one photosensitive layer as layer L2 and optionally, one or more additional layers. Layer L2 comprises the photosensitive composition according to the invention as defined herein and which may have the components with corresponding features as described earlier.

In a preferred aspect of the invention, the relief precursor has an AOX value of less than 3.2 mg/L, preferably less than 3 mg/L, more preferably less than 2.8 mg/L, even more preferably less than 2.6 mg/L. The AOX value is determined according to the method as described in example 2 of the specification.

By having the relief precursor comprising the inventive photosensitive composition, isolated dot profiles equal or less than 100 μm in diameter are possible. This may improve the resolution of the printed images. It is believed that the ionic groups in the photosensitive composition improve the relief forming capabilities of layer L2 such that, and as evident from the examples, a higher one to one ratio can be achieved. Consequently, the printing results are closer to or achieve a one to one image transfer from original to print. Therefore improving the predictability of the printing capabilities of the resulting relief structure allowing an operator to print in a more precise manner.

In a preferred embodiment, the photosensitive composition allows the relief precursor to form isolated dot profile having a diameter difference of less than 14%, preferably less than 12% more preferably less than 10% and even more preferably less than 6%. The diameter difference is determined according to the method as described in example 2.

Preferably, layer L2 has a thickness of in the range of 25 μm to 5000 μm. Preferably, layer L1 comprises a metal sheet, a steel, an alloy, a natural or artificial polymer, a polymer blend, a polymer film, or any combination thereof. A preferred layer is a PET layer, e.g a PET film, comprising polyethylene terephthalate.

Optional additional layers may be positioned between layer L1 and L2, or may be positioned above L2 or positioned both in between and above. Possible examples of these layers include a barrier layer, a laser-ablatable mask layer, an adhesion layer, UV/VIS light and/or IR light absorbing layer, a monomer diffusion control layer, a surface control layer, a protection layer, a cover foil, a cover film or combinations thereof.

Further according to the invention, there is provided a method for producing a developable relief precursor. The method comprising the steps: —providing at least one dimensionally stable carrier layer; —optionally, providing an adhesive layer and/or an adhesive treatment on the dimensionally stable carrier layer; —providing a photosensitive composition on the at least one dimensionally stable carrier layer; —optionally, providing one or more additional layers and/or treatments; and the photosensitive composition is the photosensitive composition, according to the invention as defined herein and which may have the components with corresponding features as described earlier.

Optionally, the one or more treatments are selected from the group comprising: surface treatments, adhesion treatments, corona treatment, flame treatment, chemical treatment plasma treatment, top surface coating treatment or combinations thereof.

The inventive photosensitive composition as described herein is particularly useful for manufacturing a relief precursor and/or relief structure. The manufactured relief structures are preferably used as a flexographic printing plate, a letter press plate, a pad printing plate, a relief printing plate, a flexible printed circuit board, an electronic element, a microfluidic element, a micro reactor, a phoretic cell, a photonic crystal, an optical element or a Fresnel lens. A microfluidic element or a micro reactor may be obtained by addition of an additional layer on top of the formed relief which forms channels and reaction chambers.

Further according to the invention, there is provided a method for the manufacturing of a relief structure. The method comprising the steps: —providing a relief precursor comprising the inventive photosensitive composition as described herein; —exposing the photosensitive composition to electromagnetic radiation, preferably in an image wise fashion; —removing non-exposed areas with aid of a developing liquid.

Preferably, the exposing is done through an ablated mask layer and/or wherein the exposing is done through a mask arranged between the photosensitive layer and the source of electromagnetic radiation.

Regarding the removal of non-exposed areas, this can be done by treatment with solvent-based or water-based solutions, such as, for example, organic solvents, their mixtures, water, aqueous solutions or aqueous-organic solvent mixtures, which are able to remove non-crosslinked areas in the photosensitive layer to dissolve, emulsify and/or disperse. Preferably, the developing liquid is water, one or more aqueous solutions, a polar solvent or combinations thereof. The aqueous solutions may comprise acids, bases, salts, solvents, tensides or combinations thereof.

By having the inventive photosensitive composition comprised in the relief precursor in the method for the manufacturing of the relief structure. Less chemicals are transferred into the developing liquid so that the developing liquid has an AOX value equal or lower than 3.2 mg/L, preferably equal or lower than 3 mg/L, more preferably lower than 2.8 mg/L, most preferably equal or lower than 2.6 mg/L. The AOX value is determined according to the method as described in example 2.

In a further aspect of the invention, there is provided a relief structure obtained according the method as described herein. This results in a relief structure at least having one or more of the following properties: —the relief structure has an AOX value of less than 3 mg/L, preferably less than 2.8 mg/L, even more preferably less than 2.6 mg/L, wherein said AOX value is determined according to the method as described in example 2; —the relief structure has a curling value, that is lower than 40 mm, preferably equal or lower than 35 mm, wherein the curling value is determined according to the method as described in example 2.

DETAILED DESCRIPTION OF EMBODIMENTS

Figure 1:
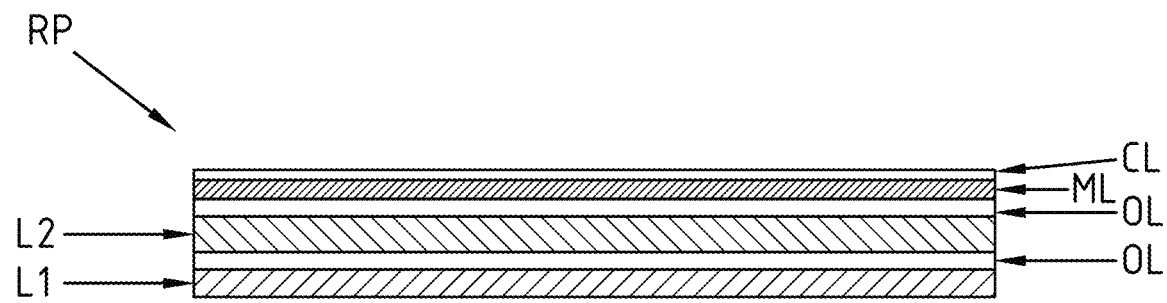
FIG. 1 schematically illustrates a developable relief precursor.

The more detailed descriptions of the various aspects of the present invention will enable one of ordinary skill in the art to better understand and implement the inventions described herein, but are not intended to and should not limit the scope of the claims attached hereto. By means of further guidance, term definitions are included to better appreciate the teaching of the present invention. All terms used in disclosing the invention, including technical and scientific terms, have the meaning as commonly understood by one of ordinary skill in the art to which this invention belongs, unless otherwise defined.

As used herein, the terms "photosensitive layer", "radiation curable layer", "photopolymerizable layer", "radiation-sensitive layer" or "relief-forming layer" can be used interchangeably. Similarly, as used herein the terms "photosensitive composition", "radiation-curable layer" "radiation curable composition", "photopolymerizable composition" wherein "composition" and "mixture" can be used interchangeably. As used herein, the term "layer" includes the terms "layers" and "layered.

As used herein, the term "component" indicates a certain molecule or a group of certain molecules making up a part of the photosensitive composition, the relief precursor and/or the relief structures as herein provided, therefore the term "component" also carries the meaning of "components". A component can comprise one or more sub components, for example component U can comprise a component E and a component EM. Or for example, component EM can comprise one or more ethylenically unsaturated monomers which are not carrying ionic groups. Or for example, component A, the additives may comprise one or more of the same or different kinds of additives.

As used herein, "pbw" stands for parts by weight.

As indicated herein before, an aspect of the present invention is based on the finding that the introduction of an ionic monomer in the photosensitive composition of a developable relief precursor, provides this material and the relief structure obtained from said precursor with unprecedent benefits on amongst others, durability, production and reliability and precision of the patterned surfaces formed on the relief structure.

It is accordingly a first objective of the present invention to provide a photosensitive composition of a developable relief precursor comprising: at least one ethylenically unsaturated monomer as component E, at least one photoinitiator or photoinitiator system as component P, at least one water soluble and/or water dispersible binder as component B and optionally, one or more additives as component A. And wherein component E comprises at least one ionic group and component E is present in an amount of 0.5 to 30 wt %, based on the total weight of the photosensitive composition.

Preferably, the developable relief precursor is a water developable relief precursor.

As already mentioned herein before, by including an ionic group into the ethylenically unsaturated monomer, the polarity of the photosensitive composition is increased and charges are brought into the polymer chain and/or into the polymer network, formed with the ethylenically unsaturated monomer as building blocks together with the water soluble and/or water dispersible binder and optional additives. The formation of the polymer chain and/or network is initiated by the photoinitiator or photoinitiator system present in the photosensitive composition according to the invention, in particular when the composition is exposed to electromagnetic radiation.

Figure 4A:
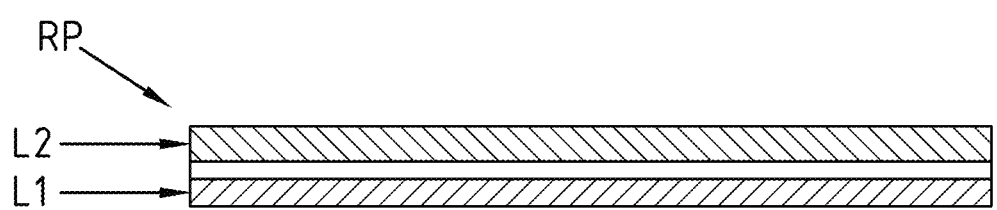
FIGS. 4A-4B illustrate the curl-up phenomena.

This formation of the polymer chain and/or network cause the photosensitive composition to cure and crosslink, thereby creating a structure resulting in a relief after removal of uncured material. By using the ionic groups in the ethylenically unsaturated monomers and thereby introducing the charges into the polymer chain and/or polymer network less harmful chemicals are released into the surroundings, for example the environment and developing liquid. Further, the time consuming step of removing the unexposed areas is shortened. Also the inventive composition, increases the flexibility of the relief precursor and relief structure and reduces the undesired and cumbersome "curl-up phenomena". The latter is illustrated in FIG. 4 for a relief precursor comprising a dimensionally stable carrier layer L1, such as a PET sheet, and a photosensitive layer L2. In FIG. 4A the relief precursor is curled up, typically due to drying and/or after a period of time in storage. The corners of the relief precursor are curled up, away from the surface 40 on which the relief precursor is resting, over a distance d.

Not only the monomers themselves but also the photosensitive composition, the produced relief precursor with the photosensitive composition and the resulting relief structure obtained thereof, are capable of better capturing and/or avoiding harmful chemicals so that the tendency of these chemicals to end up into the surroundings is reduced, in particular surroundings such as for example the environment and developing liquid, which can also be called a washing liquid. Typically, such harmful chemicals are organic halogens which one can understand as chemicals containing one or more covalently bound halogens, such as fluorine chlorine, bromine, iodine, optionally combined with carbon and other elements.

Preferably, the ionic monomers are synthesized by esterification using acrylic acids or methacrylic acids, wherein the use of organochlorides such as epichlorohydrin is reduced or avoided, so that the content of organic halogens in the synthesized ionic monomers can be lowered. Another option is an easier and more effective cleaning procedure which remove the harmful chemicals during the synthesis. The lower content of these harmful components in the photosensitive composition makes it less likely that the harmful chemicals are transferred into the developing liquid, thereby reducing the risk that they end up in the environment, in particular if the developing liquid is disposed.

Further, with the inventive composition the time consuming step of removing the unexposed areas is shortened. By bringing the ionic groups into the composition the polarity is increased and the developing liquid can penetrate the composition more easily and disperse or dissolve the unexposed areas of the photosensitive composition more quickly. Preferred developing liquids are water, aqueous solutions and polar solvents. The aqueous solutions may comprise acids, basis, salts, other solvents or tensides or combinations thereof.

The inventive photosensitive composition also increases the flexibility of the relief precursor, the flexibility of the polymer chains formed and polymer network formed. This affects the features, such as the run lengths and flexibility of the resulting relief structure after development. The charges in the polymer chains and polymer network influence the swelling capacity of the relief precursor in aqueous media and better hold or absorb water molecules. This increases the mechanical durability and flexibility of the relief precursor and especially after exposure, less deformities such as cracks or other kind of fractures are present in the relief structure. Additionally, with an improved mechanical durability and flexibility, longer run lengths can be achieved with one and the same relief structure. The relief structure can better resist the mechanical degradation or structure loss during intensive printing, for example due to high printing speeds or high printing pressures against the substrate to be printed, the hardness of the substrate to be printed etc.

Figure 4B:
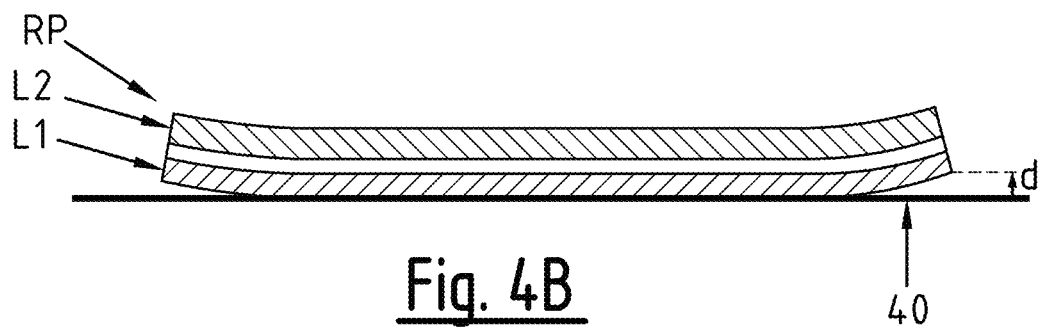

Also the intrinsic stress build-up mainly found in the formation of the relief structure is affected by the photosensitive composition, in particular during and after the exposure of the relief precursor when the polymer chains and/or polymer networks are formed. Typically, intrinsic stress differences are present in the relief precursor and even more in the relief structure due to the curing and crosslinking of the photosensitive composition after exposure. By comprising charges into the polymer chains and/or polymer network the curl-up phenomena which occurs due to the intrinsic stress differences is reduced. An example of this curl-up phenomena is illustrated in FIG. 4, wherein in FIG. 4B, a relief precursor RP is illustrated having curled up side edges.

Additionally, it is observed that due to the presence of the inventive photosensitive composition a higher surface energy of the relief structure can be achieved which lowers the contact angle of the ink applied on the relief structure which improves the wetting of the surface so that an improved ink transfer can be achieved. By having the inventive photosensitive composition in the relief structure the polarity of the surface is increased, thereby increasing the wetting of an ink when the ink is applied to the surface of the relief structure. This is in particular advantageous for polar inks Due to the increased wetting, the ink is transferred from the relief structure to the printing substrate in a more precise and more predictable manner. Further, it has been found that the relief precursor and relief structure show antistatic and anti-fouling and/or antibacterial properties.

To give the skilled artisan a better teaching of the photosensitive composition, the components are further elaborated below.

Component E, Ethylenically Unsaturated Monomer

Regarding component E, it is preferred that it is present in an amount of 0.5 to 30 wt %, preferably 0.5 to 25 wt %, based on the total weight of the photosensitive composition. More preferably component E is present in an amount of 1 to 20 wt % and even more preferably in an amount of 5 to 20 wt %. It has been found that this wt % concentration achieves optimal results, since component E, influences, among other things, the swelling capacity, water solubility and flexibility of the photosensitive composition, wherein higher concentrations tend to increase the water solubility of not only the unexposed regions of the photosensitive composition but also the exposed regions. The water solubility of the cured photosensitive composition, in particular in the exposed areas may not be too high since then also the cured photosensitive composition may get washed away during the development of the relief precursor. Additionally, higher concentrations may cause the relief structure to swell to an undesired extend. This may impact the precision and reliability printing capabilities of the relief structure, in particular when one is printing with water based ink.

In a preferred embodiment, component E has a solubility in water equal or above 200 g/l, preferably in the range of 500 to 1500 g/l, at 20° C., 1 atm and in water with a pH of 7, in order to achieve faster washing times and thereby resulting in an overall faster development process or method of manufacturing of the relief structure.

In a certain embodiment, it is favored that, component E has a molecular weight in the range of 100 to 1000 g/mol, more preferably in the range of 110 to 500 g/mol, even more preferably 120 to 300 g/mol. The molecular weight of the monomer influences, among other things, the polymer chain lengths and crosslink densities. These ranges are preferred, in order to achieve desired features such as a shorter washing time so that the unexposed regions of the relief precursor can be transferred away more quickly. Additionally, these ranges cause the resulting polymer chains and/or network to have a desired amount of flexibility, which improves the properties of the relief precursor and relief structure.

In an embodiment, component E comprises at least one of the following: an acrylate group, a methacrylate group, an acrylamide group, a vinyl group, a vinyl ether group or combinations thereof. The groups are of particular preference since they achieve desired results in regard to the polymerization and crosslinking of the photosensitive composition and show decent compatibility with the other components present in the photosensitive composition. Preferably component E comprises an acrylate group or a methacrylate group. In an embodiment component E may comprise more than one ethylenically unsaturated group.

In an embodiment, component E has a vapor pressure below 50 hPa at 25° C. The vapor pressure is determined according to the 'ASTM E1194-17' norm for vapor pressures below 1 Pa and according to the 'ASTM D2879-18' for vapor pressure equal to or above 1 Pa. In a further preferred embodiment, vapor pressures below 45 hPa, or more preferably below 40 hPa are preferred. These vapor pressures should not be too high due to environmental reasons and reasons regarding the ease, comfort and health of the operator working with either one of the components, the photosensitive composition, the relief precursor and relief structure. Additionally, the lower vapor pressure reduces the typical and rather unpleasant chemical smell which is present when one is working with the photosensitive composition, the relief precursor and relief structure.

In a particular embodiment, component E has an EOX value lower than 2000 mg/kg, preferably lower than 200 mg/kg, and more preferably lower than 50 mg/kg. The EOX value is determined according to the 'DIN 38414-17' norm using i-hexane as solvent. This value indicates extractable organic halogens, hence the name EOX. By selecting the above ranges, one reduces the risk of the harmful chemicals transferring into the surroundings, developing liquid and environment.

In a particular embodiment, component E has an AOX value lower than 2600 mg/L, preferable lower than 1000 mg/L, more preferably lower 100 mg/L. The AOX value is determined according to the 'DIN EN ISO 9562' norm and indicates adsorbable organic halides, hence the name AOX. The determination of the AOX value was performed according to point 6.2.1. By selecting these ranges, one reduces the risk of the harmful chemicals transferring into the surroundings, developing liquid and environment.

In a preferred embodiment, the at least one ionic group comprised in component E is selected from the group: a quaternary ammonium group, a carboxylate group, a sulfonate group, a sulfonium group, a phosphonium group and combinations thereof. In an embodiment component E may comprise more than one ionic group. When multiple ionic groups are present, said multiple groups may be anionic or may be cationic. Additionally, a combination is possible so that both anionic and cationic groups are present in the same ethylenically unsaturated monomer, both groups with their respective charges may form intermolecular salts or may carry matching counter ions, respective to their charge.

A quaternary ammonium has preference due to the independence of pH in regard to the charge. Quaternary ammonium cations are permanently charged and can have the following chemical formula, wherein any one of $R^1$ to $R^3$ can each independently represent an alkyl-, aryl- or alicyclic group and wherein $R^4$ represents an alkyl-, aryl- or alicyclic group substituted with an ethylenically unsaturated group.

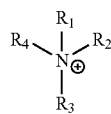

Chem. 1

The carboxylate group has preference due to a high solubility in polar solvents, hence washing times can be reduces. This group can have the following chemical formula wherein R represents an alkyl group or an aryl group substituted with an ethylenically unsaturated group.

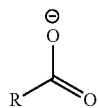

Chem. 2

The sulfonate group has preference due to the stability in the developing liquid and is further non-oxidizing, wherein R represents an alkyl group or an aryl group substituted with an ethylenically unsaturated group.

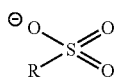

Chem. 3

The sulfonate group has a sulfonium group and is preferred due to the solvability in organic solvents, wherein any one of $R^1$ to $R^2$ can each independently represent an alkyl-, aryl- or alicyclic group and wherein $R^3$ represents an alkyl group or an aryl group substituted with an ethylenically unsaturated group.

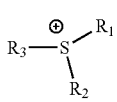

Chem. 4

The phosphonium group can be represented by the following formula, wherein any one of $R^1$ to $R^3$ can each independently represent an alkyl-, aryl- or alicyclic group and wherein $R^4$ represents an alkyl group or an aryl group substituted with an ethylenically unsaturated group.

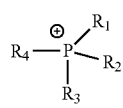

Chem. 5

In a preferred aspect of the invention, component E is a quaternized aminofunctional monomer. Such a monomer may act as a cationic detergent and can reduce undesired phenomena such as siltation when a relief precursor is washed during a development process. Additionally, a cationic group carrying monomer is less likely to interact with calcium which is often present in inks in comparison to anionic carrying groups.

Typically, this component E is added to the photosensitive composition in an aqueous solution, however a skilled artisan understands that other techniques can be used to add the monomer to the photosensitive composition. Preferably, if an aqueous solution is used, the water content of the aqueous solution is in the range of 0-60%, preferably 5-50% and the preferred pH of said aqueous solution is 3-9, or more preferably 3-7. This pH value can be measured commonly known techniques.

In certain preferred embodiments, the following ethylenically unsaturated monomer are used: 2-Trimethylammonium ethyl methacrylate chloride (TMAEMC), Methacrylamidopropyltrimethylammonium chloride, also known as 3-Methacrylamido-N,N,N-trimethylpropan-1-aminium chloride (MAPTAC), acryloxy ethyl tri methyl ammonium chloride (ADAMQUAT), a sodium salt of 2-acrylamido-2-methylpropane sulfonic acid (Na-AMPS).

TMAEMC comprises a 2-trimethylammonium ethyl methacrylate chloride and may be used to prepare water soluble cationic polymers in the photosensitive composition. This compound is for example available as aqueous solution with a solid content of around 75% via Evonik Industries AG with the commercial name VISIOMER®TMAEMC and is represented by the following chemical formula and has a molecular weight of 207.7 g/mol.

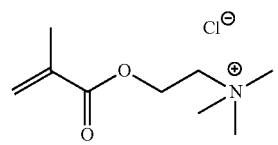

Chem. 6

MAPTAC comprises a Methacrylamidopropyltrimethylammonium chloride, also known as 3-Methacrylamido-N,N,N-trimethylpropan-1-aminium chloride. This compound is used to bring a cationic charge to the polymer chains in the photosensitive composition. This compound is for example available as aqueous solution with a solid content of around 50% via Evonik Industries AG with the commercial name VISIOMER®MAPTAC and is represented by the following chemical formula and has a molecular weight of 220.5 g/mol.

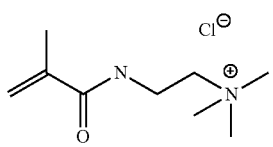

Chem. 7

ADAMQUAT comprises a cationic monomer, acryloxy ethyl tri methyl ammonium chloride, used to bring a cationic charge to the polymers in the photosensitive composition. This component is for example available as aqueous solution with a solid content of around 80% via Arkema S.A. with the commercial name ADAMQUAT MC 80 and is represented by the following chemical formula and has a molecular weight of 193.67 g/mol.

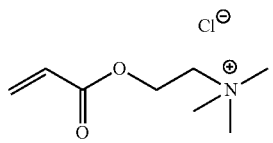

Chem. 8

Na-AMPS comprises a Sodium salt of 2-acrylamido-2-methylpropane sulfonic acid and brings an anionic charge to the polymer chains in the photosensitive composition. This component is for example available as aqueous solution with a solid content of around 50% via Sigma-Aldrich Chemie GmbH and is represented by the following chemical formula and has a molecular weight of 229.23 g/mol.

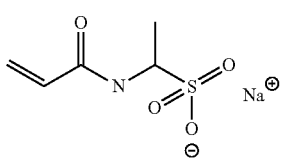

Chem. 9

Also, the following components may be used regarding the ethylenically unsaturated monomer: DMAEMDMS, trimethyl({2-[(2-methylprop-2-enoyl)oxy]ethyl})azanium methyl sulfate, which may be represented by the following formula and has a molecular weight of 283,343 g/mol.

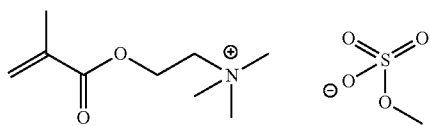

Chem. 10

PSPA, 3-sulfopropyl acrylate potassium salt which may be represented by the following formula below and has a molecular weight of 232.30 g/mol.

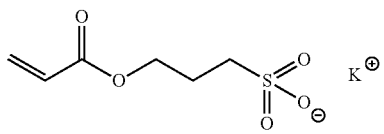

Chem. 11

Also zwitterionic monomers or betaine-monomers may be used as the ethylenically unsaturated monomer. Suitable zwitterionic monomers are: dimethyl({2-[(2-methylprop-2-enoyl)oxy]ethyl})(3-sulfopropyl)azanium hydroxide represented by the chemical formula below.

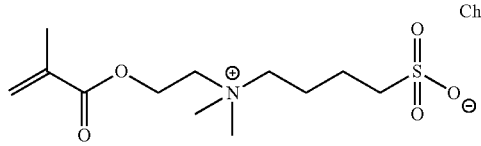

Chem. 12

Another suitable zwitterionic monomer is 2-ethenyl-1-(3-sulfopropyl)pyridin-1-ium represented by the chemical formula below.

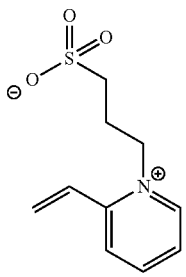

Chem. 13

Counter Ions

The photosensitive composition being electrically neutral, will typically comprise a counter ion which is present in the photosensitive composition as component I. Component I is selected from an anionic group, if the at least one ionic group comprised in component E is cationic; Alternatively, component I is a cationic group, if the at least one ionic group of component E is anionic; Alternatively, component E can have zwitterionic properties and then the counter ion may be selected from either the anionic group or cationic group or both. It is preferred that component E, comprises a cationic group due to ink compatibility reasons, for example anionic groups may interact with calcium ions present in the ink, thus the counter ion is preferably cationic to prevent such interaction.

Component I may be selected from an anionic group comprising: chloride, bromide, iodide, fluoride, sulfonate, methyl sulfate, sulfate, tosylate, nitrate, a halogen anion, a sulfonium anion, a tosylate anion, a borate anion, a nitrate anion, a methyl sulfate anion, halogen anion, or combinations thereof;

Component I may be selected from an cationic group comprising: ammonium, sodium, aluminum, calcium, cesium, chromium, copper, barium, iron, lead, lithium, magnesium, nickel, potassium, rubidium, silicon, silver, strontium, titanium, zinc, zirconium, an ammonium cation, a alkali cation, an earth alkali cation, a phosphonium cation, a sulfonium cation, or combinations thereof;

Further examples of suitable compounds for component E are shown below.

Salts of methacrylic acids such as sodium 2-methylprop-2-enoate, aluminium(3+) tris(2-methylprop-2-enoate), ammonium 2-methylprop-2-enoate, calcium bis(2-methylprop-2-enoate), bis(methacrylato-O)chromium, copper bis(2-methylprop-2-enoate), barium bis(2-methylprop-2-enoate), 2-methylprop-2-enoic acid, iron (III) salt, 2-methylprop-2-enoic acid, lead salt, 2-methylprop-2-enoic acid, lithium salt, magnesium bis(2-methylpropan-2-olate, nickel 2-methylprop-2-enoate, potassium 2-methylprop-2-enoate, 2-methylprop-2-enoic acid, rubidium salt, 2-methylprop-2-enoic acid, silicon salt, 2-methylprop-2-enoic acid, silver salt, 2-methylprop-2-enoic acid, strontium salt, 2-methylprop-2-enoic acid, titanium (IV) salt, 2-methylprop-2-enoic acid, zinc salt, zirconium(4+) tetrakis(2-methylprop-2-enoate) are further examples for component E.

Salts of acrylic acids such as 3-sulfopropyl acrylate, potassium salt, ammonium prop-2-enoate, 2-propenoic acid, sodium salt, 2-propenoic acid, aluminum salt, 2-propenoic acid, barium salt, 2-propenoic acid, calcium salt, 2-propenoic acid, cesium salt, 2-propenoic acid, chromium (III) salt, 2-propenoic acid, copper (II) salt, 2-propenoic acid, iron (III) salt, 2-propenoic acid, lead salt, 2-propenoic acid, lithium salt, 2-propenoic acid, magnesium salt, 2-propenoic acid, nickel (II) salt, 2-propenoic acid, potassium salt, 2-propenoic acid, silver salt, 2-propenoic acid, strontium salt, 2-propenoic acid, zinc salt, 2-propenoic acid, zirconium salt, potassium acrylate, rubidium acrylate are additional examples for component E.

Vinyl/allyl type salts such as Allyltriethylammonium Iodide, Allyltrimethylammonium Bromide, Diallyldimethylammonium Chloride, 1-(3-Sulfopropyl)-2-Vinylpyridinium Betaine, p-Vinyl Benzyl Trimethylammonium Chloride are additional examples for component E.

Component EM, Ethylenically Unsaturated Compound which does not Comprise an Ionic Group In an embodiment, the photosensitive composition further comprises at least one ethylenically unsaturated compound as component EM which does not comprise an ionic group. The ethylenically unsaturated compounds contemplated are those which are compatible with the polymeric binder or binders of component B. The ethylenically unsaturated compound preferably contains at least 2 ethylenically unsaturated groups, more preferably 2 to 6 ethylenically unsaturated groups, even more preferably exactly 2 ethylenically unsaturated groups. Compounds having C—C triple bonds may also be used in the photosensitive composition. Component EM is preferably an acrylate and/or a methacrylate group, although acrylamides, vinyl ethers or styrene derivatives may also be employed as ethylenically unsaturated compounds. The ethylenically unsaturated compound with no ionic group may be a monomeric, oligomeric or polymeric ethylenically unsaturated compound, and may have a linear, branched, star-shaped or dendritic structure. In an embodiment, component EM has a low molecular weight of less than 5000 g/mol, preferably less than 3000 g/mol, more preferably less than 1000 g/mol, very preferably less than 500 g/mol, and may even be less than 300 g/mol but preferably at least 72.06 g/mol, more preferably at least 86 g/mol.

Preferred ethylenically unsaturated compounds as component EM are derivatives of acrylic and/or methacrylic acid, such as their esters with mono- or polyhydric alcohols, examples being acrylic or methacrylic esters of alkanols having 1 to 20 carbon atoms, such as methyl methacrylate, ethyl acrylate, propyl (meth)acrylate, isopropyl (meth)acrylate, n-butyl (meth)acrylate, isobutyl (meth)acrylate, tert-butyl (meth)acrylate, hexyl (meth)acrylate, cyclohexyl (meth)acrylate, 2-ethylhexyl (meth)acrylate, lauryl (meth)acrylate, (meth)acrylic esters of polyhydric alcohols having 2 to 20 carbon atoms, e.g., 2 hydroxyethyl (meth)acrylate, 2-hydroxypropyl (meth)acrylate, ethylene glycol di(meth)acrylate, polyethylene glycol di(meth)acrylate, butane-1,4-diol di(meth)acrylate, neopentyl glycol di(meth)acrylate, 3 methylpentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di-, tri-, and tetraethylene glycol di(meth)-acrylate, tripropylene glycol di(meth)acrylate or pentaerythritol tetra(meth)acrylate, and additionally poly (ethylene oxide) di(meth)acrylate, m methylpoly(ethylene oxide)-yl (meth)acrylate, N,N-diethylaminoethyl acrylate, a reaction product of 1 mol of glycerol, 1 mol of epichlorohydrin, and 3 mol of acrylic acid, and also glycidyl methacrylate and bisphenol A diglycidyl ether acrylate, (Meth) acrylic acid derivatives with carboxylic acid and/or amino groups.

Further, particularly preferred compounds as component EM are derivatives of acrylamide and of methacrylamide, such as, for example, ethers of their N-methylol derivatives with mono- and polyhydric alcohols, e.g., ethylene glycol, glycerol, 1,1,1-trimethylolpropane, oligomeric or polymeric ethylene oxide derivatives. These compounds are of particular preference if polyamides or polyvinyl alcohol are used as binders in the photosensitive composition.

Further, preferred compounds as component EM are so-called epoxy (meth)acrylates and urethane (meth)acrylates, of the kind obtainable for example by reaction of bisphenol A diglycidyl ether with (meth)acrylic acid or by reaction of diisocyanates with hydroxyalkyl (meth)acrylates or with hydroxyl-containing polyesters or polyethers.

Other preferred compounds that can be used as component EM are ethylenically unsaturated compounds such as esters of acrylic acid or methacrylic acid, especially those with pressure below 10 Pa at 25° C., end even more preferred below 1 Pa as predicted via QSAR MPBPWIN v. 143 (modified Grain Method) and those modified with compatibilizers, e.g., with hydroxyl, amido, sulfoester or sulfonamide groups.

Further, preferred compounds as component EM are phenyl glycidyl ether acrylate, glycerol dimethacrylate, 1,4-butanediyl bis[oxy(2-hydroxy-3,1-propanediyl)] diacrylate, 2-hydroxyethyl methacrylate, 2,3-epoxypropyl methacrylate, ethyl diglycol acrylate, hydroxypropyl acrylate, butanediol diacrylate, triethylene glycol diacrylate, bisphenol A diglycidyl ether diacrylate, 2-(dimethylamino)ethyl methacrylate, tert-butylaminoethyl methacrylate, tert-butyl acrylate, polyethylene glycol methacrylate, benzyl acrylate, tetrahydrofurfuryl acrylate, phenoxymethyl methacrylate, vinylpyrrolidone, and vinyl acetate, and also the corresponding methacrylates, Further, preferred compounds as component EM are phenyl glycidyl ether acrylate, glycerol diacrylate, 1,4-butanediyl bis[oxy(2-hydroxy-3,1-propanediyl)] diacrylate, ethylene diacrylate, 2-hydroxyethyl methacrylate, butanediol diacrylate, hexanediol diacrylate, and also the corresponding methacrylates. In one embodiment, the photosensitive composition comprises phenyl glycidyl ether acrylate. Also mixtures or combinations of the above mentioned preferred compounds as component EM may be used, preferably mixtures of the above described copolymerizable, ethylenically unsaturated, organic compounds.

In a preferred embodiment, the ethylenically unsaturated monomer comprising an ionic group as component E and the ethylenically unsaturated compound which does not carry an ionic group as component EM are present together in the photosensitive composition in amounts of 0.5 to 50 wt %, preferably of 1 to 40 wt %, more preferably of 5 to 40 wt %, even more preferably in the range from 10 to 40 wt %, based on the overall formulation of the photosensitive composition. Of particular preference is that the ratio of (concentration of component EM/concentration of component E), herein after "ratio EM/E", is between 0.1 and 10, more preferably 0.15 and 8, even more preferably between 0.2 and 5. Wherein component EM comprises the ethylenically unsaturated monomeric compound or compounds not carrying an ionic group, as described herein or a combination of the described components as component EM thereof. And wherein, component E comprises the components carrying an ionic group as described herein, or a combination of the earlier described components as component E thereof.

In an embodiment, component E is present in an amount of 11-21 pbw and/or in a concentration of 1.5 to 21 wt % based on the total formulation, this concentration achieves a quick washing time.

In an embodiment of the invention, the ratio EM/E is less than 4,6, preferably less than 4. This ratio has been found to reduce the unwanted curling-phenomena the most.

Component P, Photoinitiator or Photoinitiator System

The photoinitiator or photoinitiator system is selected to react to electromagnetic radiation, in particular in the UV range of the electromagnetic spectrum. Without to be bound to any specific polymerization reaction, the invention will be explained in accordance to the principles of radical polymerization although a skilled person understands that different mechanisms and several side reactions are possible, for example anionic or cationic polymerization reactions may be present to a lesser extent. The photoinitiator or photoinitiator system initiates the polymerization reaction by forming radicals under the influence of UV light, typically between 100-400 nm, more preferably around 385-395 nm. Thereby influencing the curing and crosslinking of the photosensitive composition. In particular, the photoinitiators or photoinitiator system are selected in accordance to the curing and crosslinking principles using UV LED technology. A skilled artisan appreciates that the typical older standard ways, for example using standard lamps such as a mercury lamp, may also be used since those lamps emit electromagnetic radiation in a broad spectrum. In an embodiment, component P comprises one or more polymerization photoinitiators. Suitable initiators or initiator systems made up of at least 2 components which on irradiation with electromagnetic waves generate radicals which bring about polymerization and/or crosslinking Initiators of these kinds are known to the skilled person and described for example in the following references: Bruce M. Monroe et al., Chemical Review, 93, 435 (1993), R. S. Davidson, Journal of Photochemistry and Biology A: Chemistry, 73, 81 (1993), M. Tsunooka et al., 25 Prog. Polym. Sci., 21, 1 (1996), F. D. Saeva, Topics in Current Chemistry, 1 56, 59 (1990), G. G. Maslak, Topics in Current Chemistry, 168, 1 (1993), H. B. Shuster et al., JACS, 112, 6329 (1990) and I. D. F. Eaton et al., JACS, 102, 3298 (1980), P. Fouassier and J. F. Rabek, Radiation Curing in Polymer Science and Technology, pages 77 to 117 (1993) or K. K. Dietliker, Photoinitiators for free Radical and Cationic Polymerisation, Chemistry & Technology of UV & EB Formulation for Coatings, Inks and Paints, Volume, 3, Sita Technology LTD, London 1991; or R. S. Davidson, Exploring the Science, Technology and Applications of U.V. and E.B. Curing, Sita Technology LTD, London 1999. Further initiators are described in JP45-37377, JP44-86516, U.S. Pat. Nos. 3,567, 453, 4,343,891, EP109772, EP109773, JP63138345, JP63142345, JP63142346, JP63143537, JP4642363, JP59152396, JP61151197, JP6341484, JP2249 and JP24705, JP626223, JPB6314340, JP1559174831, JP1304453, and JP1152109. Preferred initiators or initiator systems made up of at least 2 components are those also known as the group of the initiators, generally known as Norrish type I or Norrish type II or components which are capable to perform electron transfer reactions upon irradiation. Norrish type I initiators include, for example, benzoyl radical-forming initiators, α-hydroxyketones, α-aminoketones, acylphosphine oxides, bisacylphosphine oxides, triazines, and hexaarylbisimidazoles, which may additionally be combined with dyes or sensitizers to increase the sensitivity. The Norrish type II initiators are, in particular, combinations of ketones or aldehydes with H-transfer agents such as, for example, amines or thiols.

Regarding component P, it is preferred to select said component P from the group comprising: a benzyl ketal, hydroxy ketone, an amino ketone, an acyl phosphine oxide, a bis acyl phosphine oxide, a thioxanthone, an anthraquinone, a coumarine, a hexaarylbisimidazole, a benzophenone, and combinations thereof. These groups are of preference since they form a suitable degree of radical forming and allow curing at low irradiance, preferably between 16-20 Watts/cm$^2$ although lower ranges may be possible. Preferred initiators are: benzil dimethyl ketal, diphenyl(2,4, 6-trimethylbenzoyl)phosphine oxide, 2,4,6-trimethylbenzoylphenyl phosphinate, bis(2,4,6-trimethylbenzoyl)phenylphosphine oxide, bis(2,6-dimethoxybenzoyl)-2,-1,4-trimethylpentyl) phosphine oxide, Michler's ketone, and benzophenone, alone and/or in combination with sensitizers, amines or thiols, and any desired combinations thereof. Further suitable initiators are onium salts, organic peroxides, thio compounds, ketoximes, borates, azinium compounds and azo compounds, metallocenes and compounds having a carbon-halogen group, which may likewise be used in combination or together with sensitizers, amines or thiols. Examples of the sensitizers which can be used are xanthones, thioxanthones, anthracenes, perylenes, phenothiazines, benzophenones, acetophenones, and dyes. A requirement for sensitization is either that the triplet energy of the sensitizer is higher than that of the initiator to be sensitized, or that an electron transfer from an excited state of the sensitizer is possible. Further, component P may be a photo initiator system that further comprises a co-initiator selected from the group comprising: an amine, a thiol, a thioether, an amino alcohol, a thioether amine and combinations thereof. A combination of several of the above photoinitiators can be used to initiate curing in different wavelength ranges, which can be faster than using a single photoinitiator. The wavelength of the electromagnetic radiation is in the range from 200 to 2000 nm, preferably in the UV range, more preferably in the range from 250 to 550 nm, very preferably in the range from 300 to 450 nm. Besides broad-spectrum irradiation of the electromagnetic waves, it may be advantageous to use narrow-spectrum or monochromatic wavelength ranges, of the kind which can be generated using corresponding filters, lasers or light-emitting diodes (LEDs). In these cases, wavelengths in the ranges of 350, 365, 385, 395, 400, 405, 532, 830, and 1064 nm, individually (and around 5-10 nm above and/or below) or as combinations, are preferred. The initiators or initiator combinations representing component P have at least one absorption maximum within these wavelength ranges, it is not necessary for the position of the absorption maximum of photoinitiator and/or photoinitiator system to coincide with the emission maximum of the electromagnetic radiation, but it is advantageous if the two maxima overlap to a very high degree. It is also possible to select two or more different photo initiators having each different absorption maximum, which therefore may react to a different set of wavelength ranges. In an embodiment, the photosensitive composition comprises component P in amounts of 0.1 to 20 wt %, based on the overall formulation. The initiator concentration is preferably 0.1 to 10 wt %, more preferably 0.1 to 5 wt %, even more preferably 0.5 to 5 wt %.

Component B, Water Soluble and/or Water Dispersible Binder

The water soluble and/or water dispersible binder comprised in the photosensitive composition can be reactive and functionalized, thereby carrying groups that can be crosslinked during the polymerization or curing reaction. Additionally or alternatively, the binder may be a non-reactive binder. Preferably, the binder is crosslinkable with the polymer chains formed by component E, the ethylenically unsaturated monomer and/or crosslinkable with other additives. To balance the final properties of the relief precursor and resulting relief structure, both reactive binders and non-reactive binders may be combined. The binders can be linear, branched, star-shaped or dendritic and can be present both as homopolymers, statistical copolymers, block copolymers or alternating copolymers.

The binders are very often provided with functional groups which either increase the solubility and/or can participate in crosslinking reactions. These groups include, for example, carboxy, SO3, OH, thiol, ethylenically unsaturated (meth) acrylate, epoxy groups and any combination thereof.

In an embodiment, component B is selected from the group comprising: a polyvinyl alcohol, a polyvinyl acetate, a partially hydrolysed polyvinyl acetate, a functionalized polyvinyl alcohol, a functionalized polyvinyl acetate, a functionalized partially hydrolyzed polyvinyl acetate, a polyvinyl acetal, a copolymer of polyvinyl acetate and at least one other monomer (e.g. ethylene, propylene or Vinylhexanoate, Vinylpropionate or Vinyl-n-butyrate), a polyvinyl acetate polymer or copolymer with at least one grafted unit, polyurethanes, polyacrylates, polyamides, or combinations thereof. Preferably, the functionalized polyvinyl alcohol and/or functionalized partially hydrolyzed or non-hydrolyzed polyvinyl acetate are functionalized with ethylenically unsaturated groups, and/or the at least one other monomer in the copolymer of polyvinyl acetate is ethylene, and/or the at least one grafted unit of the polyvinyl acetate polymer or copolymer is polyethylene glycol. The preparation of a partially hydrolyzed functionalized polyvinyl acetates is known and described for example in USRE2740, DE3015419, EP0079514, DE3322993, DE3322994, EP849635, EP962828 and WO2019106082, hereby incorporated by reference. Photosensitive compositions and relief structures generated from them are likewise known and described for example in DE3015419, EP0079514, DE3322993, DE3322994, EP849635, and EP962828, hereby incorporated by reference.

The total amount of component B in the photosensitive composition is preferably 30 to 90% by weight, based on the sum of all constituents of photosensitive composition, preferably 40 to 85% by weight and particularly preferably 45 to 85% by weight.

Additional or alternative suitable binders are further described below. DE3015419 describes the use of functionalized, part-hydrolyzed polyvinyl acetates in an adhesion-promoting interlayer between the dimensionally stable carrier layer and photosensitive layer. EP0079514 shows the use of functionalized, part-hydrolyzed polyvinyl acetates, obtained by means of an excess of functionalizing agent, in relief structures, with the objective of improving the stability on drying.

DE3322993 and DE3322994 describe an improved preparation process for functionalized, part-hydrolyzed polyvinyl acetates, through the use of catalysts, and describe the use of the functionalized, part-hydrolyzed polyvinyl acetates for generating relief structures. EP849635 describes a radiation-curable mixture comprising two different binders, one of which is a functionalized, part-hydrolyzed polyvinyl acetate with a high degree of functionalization.

EP962828 describes a further improvement in the synthesis of functionalized, part-hydrolyzed polyvinyl acetates, and the use thereof in radiation-curable mixtures for generating relief structures. WO2018141644 describes the use of functionalized part-hydrolyzed polyvinyl acetates in a photosensitive composition for relief precursors which are preferably used as reactive binders. The binders may also be completely or partially hydrolyzed polyvinyl esters, e.g., part-hydrolyzed polyvinyl acetates, polyvinyl alcohol derivatives, such as part-hydrolyzed vinyl acetate/alkylene oxide graft copolymer, and also mixtures thereof. The binder may also be a polyamide soluble in water or water/alcohol mixtures, of the kind described in EP0085 472 or in DE1522444, for example may be used.

The concentration of the additional or alternative suitable binders, if present, is generally in the range from 1 to 50 wt %, preferably in the range from 1 to 40 wt %, more preferably in the range from 1 to 35 wt %, and very preferably in the range from 1 to 30 wt %, based on the overall formulation of the photosensitive composition.

Component A, Optional Additives

In an embodiment, the photosensitive composition may comprise one or more additives selected from the group consisting of plasticizers, solvents, further polymeric binders, colorants, stabilizers, inhibitors, thermal inhibitors, chain transfer agents, UV absorbers, dispersing assistants, organic or inorganic fillers, further, nonradical crosslinkers, viscosity modifiers, and hydrogen bond-accepting additives.

In an embodiment, the additives are present in the photosensitive composition in a range from 0.001 to 50 wt %, more preferably 0.01 to 40 wt %, even more preferably 0.1 to 30 wt %, and most preferably of 1 to 20 wt %, based on the overall formulation of the photosensitive composition. Individual additives may be included in concentrations of 0.001 to 30 wt %, preferably in the range from 0.001 to 20 wt %, more preferably in the range from 0.001 to 10 wt %, and very preferably in the range from 0.001 to 5 wt %, based on the overall formulation of the photosensitive composition. In an embodiment, plasticizers are present in the composition, such as for example, polyethylene glycols, glycerol, ethylene glycol, N-alkylbenzenesulfonamides, phthalates, and any desired mixtures thereof. Other examples of suitable plasticizers are aliphthalic acid esters, e.g., dimethyl phthalate, diethyl phthalate, dibutyl phthalate, diisobutyl phthalate, diocyl phthalate, octyl caprylyl phthalate, dicyclohexyl phthalate, ditridecyl phthalates, butyl benzyl phthalate, diisodecyl phthalates or diallyl phthalates; glycol esters, e.g., dimethyl glycol phthalates, ethyl phthalylethylglycolate, methyl phthalylethylglycolate, butyl phthalylbutylglycolate or triethylene glycol dicaprylic ester; phosphoric-acid esters, e.g., tricresyl phosphate or triphenyl phosphate; aliphatic diesters, e.g., diisobutyl adipate, dioctyl adipate, dimethyl sebacetate, dibutyl sebacetate, dioctyl azelate or dibutyl maleate; pentaerythritol polyoxyethylene ethers; polyglycidyl methacrylate; triethyl citrate; glycerol triacetyl ester, and butyl laurate. The plasticizer content is generally 1 to 30 wt %, preferably 1 to 20 wt %, more preferably 1 to 10 wt %, and very preferably 3 to 10 wt %, based on the overall formulation of the photosensitive composition.

In an embodiment, thermal polymerization inhibitors are present that preferably exhibit no notable absorption of their own in the actinic range corresponding to the absorbance spectrum of the photoinitiator or photoinitiator system, examples include 2,6-di-tert-butyl-p-cresol, hydroquinone, p-methoxyphenol, β-naphthol, phenothiazine, pyridine, nitrobenzene, m-dinitrobenzene or chloranil; thiazine dyes, such as thionine blue G (C.I. 52025), methylene blue B (C.I. 52015) or toluidine blue (C.I. 52040); or N-nitrosamines, such as N-nitrosodiphenylamine, or the salts—for example, the potassium, calcium or aluminum salts—of N-nitrosocyclohexylhydroxylamine. Other suitable inhibitors and stabilizers are described for example in A. Valet, Lichtschutzmittel für Lacke, 33ff, Vincentz Verlag Hannover 1996. Particularly preferred are sterically hindered phenols and amines.

In an embodiment, colorants are added, which may be dyes, pigments or photochromic additions to the photosensitive composition. Preferably they are added in an amount of 0.0001 to 2 wt %, based on the composition. Suitable colorants are, for example, soluble *phenazinium*, phenoxazinium, acridinium, and phenothiazinium dyes, such as neutral red (C.I. 50040), safranin T (C.I. 50240), rhodanil blue, the salt or amide of rhodamine D (Basic Violet 10, C.1. 45170), methylene blue B (C.I. 52015), thionine blue G (C.I. 52025), acriflavin (C.I. 46000), acridine orange (C.I. 46005) or Solvent Black 3 (C.I. 26150). They serve to control the exposure properties, as chain transfer agents, and/or are used for identification, for direct control of the exposure outcome, or for esthetics.

In an embodiment, the dyes may also be used together with a reducing agent which does not reduce the dye in absence of actinic light but is able to reduce the dye in the excited electronic state upon exposure. Examples of such reducing agents are ascorbic acid, anethole, thiourea, e.g., diethylallylthiourea, especially N-allylthiourea, and also hydroxylamine derivatives, especially salts of N-nitrosocyclohexylhydroxylamine, preferably the potassium, calcium, and aluminum salts. The reducing agents are able, to act as inhibitors of thermally initiated polymerization. The reducing agents may be added in general in amounts of 0.005 to 5 wt %, based on the composition, and in many cases the addition of 3 to 10 times the amount of dye used has been found appropriate. In an embodiment, chain transfer agents, also called modifiers or regulators may be added to control the polymer chain length during the curing reaction to achieve certain mechanical and processing properties. Suitable chain transfer agents are for example, hydroxylamine derivatives, especially salts of N-nitrosocyclohexylhydroxylamine, preferably the potassium, calcium, and aluminum salts, or —SH-containing compounds such as mercaptoethanol, mercaptopropanol, thiophenol, thioglycerol, ethyl thioglycolate, methyl thioglycolate, dodecyl mercaptan or mercaptoacetic acid, organic halogen compounds, such as tetrachloromethane.

In an embodiment, UV absorbers employed are compounds such as, for example, hydroxyphenylbenzotriazoles, hydroxybenzophenones, hydroxyphenyl-s-triazines, oxalanilides, hydroxyphenyl pyrimidines, salicylic acid derivatives, and cyanoacrylates, as described in A. Valet, Lichtschutzmittel für Lacke, 20ff, Vincentz Verlag Hannover 1996, and any desired combinations thereof. UV absorbers in the photosensitive composition may likewise have advantages and have a positive influence on the formation of relief.

In an embodiment, dispersing assistants may be added to the photosensitive composition. These increase the dispersion of components like: pigments, dyes, nanoparticles or inorganic fillers which may be present in the composition. Exemplary dispersing assistants are: mono- and polyfunctional carboxylic or sulfonic acids, alcohols or amines. As additional, non-radically crosslinking crosslinkers it is possible to use mono- and polyfunctional aldehydes, polyfunctional epoxides, polyfunctional carboxylic acids, and polyfunctional carboxylic anhydrides, and any desired combinations, in the radiation-curable mixture. These include, in particular, formaldehyde, acetaldehyde, propylaldehyde, valeraldehyde, caproaldehyde, pivalaldehyde, glyoxal, glutaraldehyde (1,5-pentanedial), succinaldehyde (butanedial), terephthalaldehyde, 1,2,3,4-diepoxybutane, 1,2:5,6-diepoxyhexane, 1,2:7,8-diepoxyoctane, epoxy resins, such as bisphenol A diglycidyl ether and epoxyphenol novolacs, oxalic acid, malonic acid, succinic acid, glutaric acid, adipic acid, pimelic acid, suberic acid, azelaic acid, sebacic acid, tartaric acid, citric acid, terephthalic acid, phthalic acid, aspartic acid, glutamic acid, maleic anhydride, succinic anhydride, and phthalic anhydride.

In an embodiment, viscosity modifiers may be employed in the photosensitive composition, for example besides or in addition to water-soluble or dispersible polymers, also surfactants or surface-active substances can be used.

In an embodiment, the photosensitive composition may comprise at least one hydrogen bond forming additive that is capable of forming hydrogen bonds with the binder and is selected from the group consisting of alcohols, ketones, aldehydes, amines, amides, amino acids, carboxylic acids, thioethers, thiols, urethanes, esters, lactones, lactams, and any desired combinations thereof. Preferably, the hydrogen bond-forming additive is selected from the group consisting of polyols, polyamines, polyethers, polyesters, polyamides, and ionic polymers, examples being anionic polymers such as polystyrenesulfonic acid. Particularly preferred as hydrogen bond forming additives are polyethyleneimine, polyurethanes having ethylene glycol units. In an embodiment, the polyurethane acrylate PUA BIN 200 available via BASF, polyethylene glycol such as PEG-400 and PEG-2000, and polyvinyl alcohol/polyethylene glycol graft copolymers such as Alcotex 97-5, and any desired combinations thereof are preferred. In one specific embodiment, the hydrogen bond forming additive is a polyvinyl alcohol/polyethylene glycol graft copolymer. The hydrogen bond forming additive is present in general in an amount of 1 to 30 wt %, preferably 1 to 25 wt %, more preferably 5 to 20 wt %, and very preferably 10 to 20 wt %, based on the overall formulation.

The Developable Relief Precursor (RP)

FIG. 1 schematically illustrates a developable relief precursor RP comprising: a dimensionally stable carrier layer L1, at least one photosensitive layer L2 and optionally, one or more additional layers, such as an optional layer OL and a laser ablatable mask layer ML. Layer L2 comprises the inventive photosensitive composition, as described herein and which may have the components with corresponding features as described earlier. By having the photosensitive composition as described herein comprised herein, one or more advantages as described earlier can be achieved.

In a preferred aspect of the invention, the relief precursor has an AOX value of less than 3.2 mg/L, preferably less than 3 mg/L, more preferably less than 2.8 mg/L, even more preferably less than 2.6 mg/L. The AOX value is determined according to the method as described in example 2 of the specification. These desired values are achieved due to the incorporation of the photosensitive composition.

By having the relief precursor comprising the inventive photosensitive composition, isolated dot profiles equal or less than 100 μm in diameter are allowed. This may improve the resolution of the printed images. Further, it is believed that the ionic groups in the photosensitive composition improve the relief forming reaction in layer L2 such that the resulting relief structure may achieve printing results which are closer to a one to one image transfer from original to print. Therefore, a higher printing predictability and precision is achieved. The composition as described herein improves the equalness between a pattern made with, for example, transparent regions on photographic mask or a pattern made on a laser ablatable mask layer and the resulting printed area.

Figure 2A:
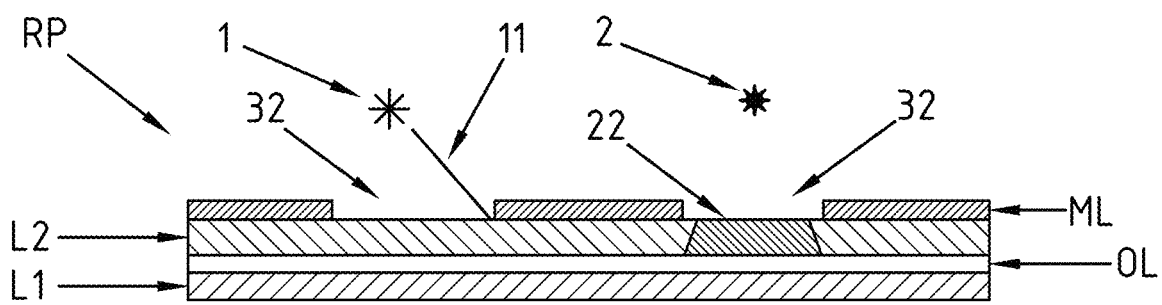
FIGS. 2A-2B illustrate the principles of developing a relief precursor.
Figure 2B:
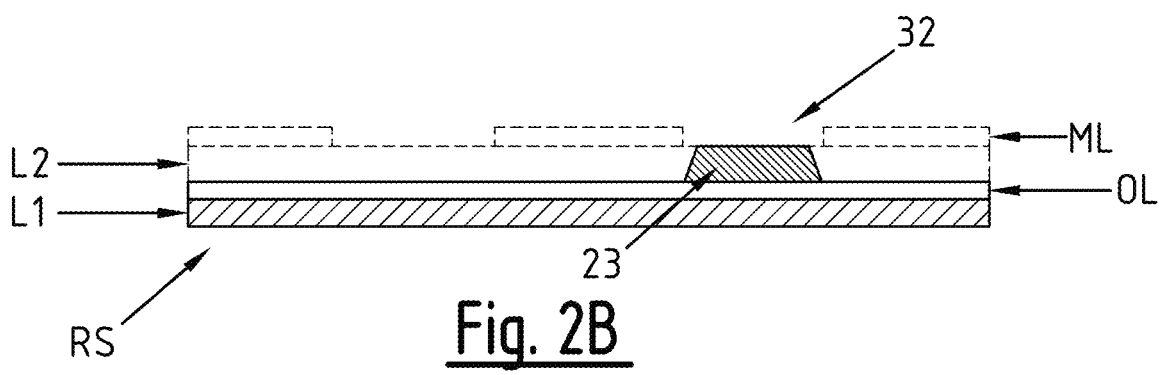

FIG. 2, illustrate the principles of developing a relief precursor, as will further be described herein. In FIG. 2A a cross section of a relief precursor RP is shown after removal of the cover layer CL and the partial ablation of the mask layer ML as a result of an imaging process controlled by, for example an energy source 1 as illustrated on FIG. 2A. Preferably, this energy source is a laser and ablates the mask layer ML away with a laser beam 11, creating an open area 32 as for example illustrated in FIG. 2A. In addition or alternatively, the mask layer can be modified in its absorption and/or reflection properties so that the layer becomes at least partially transparent to the electromagnetic radiation used during the exposure of the relief precursor. The mask layer may further comprise additional components such as binders and additives which ensure effective processability, film formation, and development. The mask layer is preferably a laser-ablative mask layer ML which can be removed by laser radiation 1, as a result of a high energy input 11, as for example illustrated on FIG. 2A. Laser removal is only taking place at the locations 32 where a laser beam 11 is or was directed on the mask layer. In this way, an image or pattern is created in the mask layer, which can later form an equal or similar image or pattern on the resulting relief structure. Successive exposure to electromagnetic radiation 2, such as shown in FIG. 2A, in the exposed regions 22 of the photosensitive layer L2 cause a crosslinking and/or polymerization reaction in layer L2. Afterwards, the mask layer ML and unexposed material of the photosensitive layer L2 are removed, as illustrated by the dashed lines in FIG. 2B, thereby creating a relief structure RS with a cured and/or polymerized relief 23 thereon.

Figure 3A:
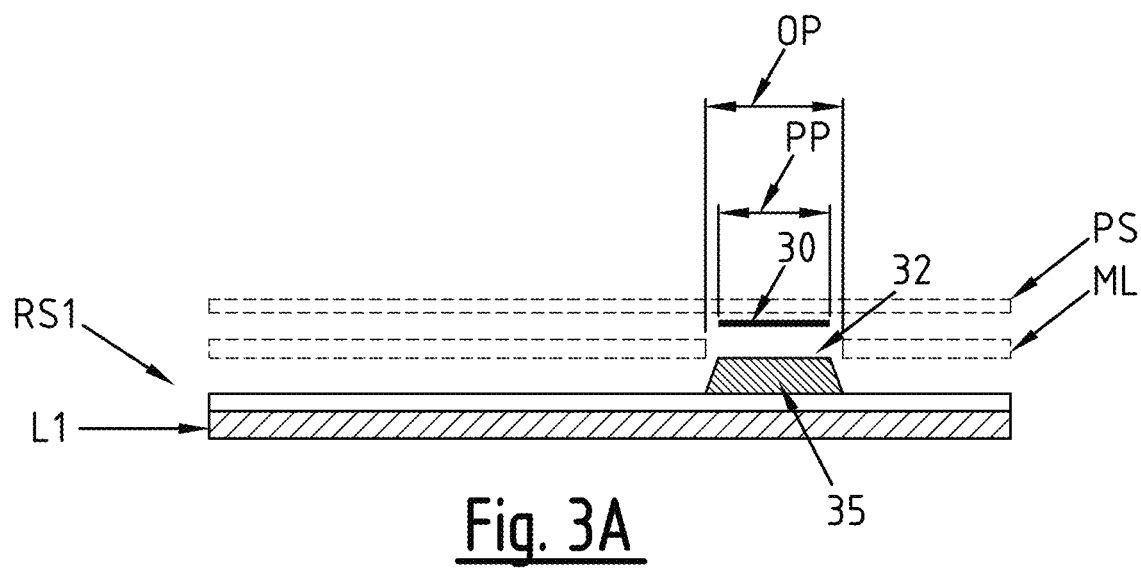
FIGS. 3A-3B illustrate the effect of an improved one to one ratio.
Figure 3B:
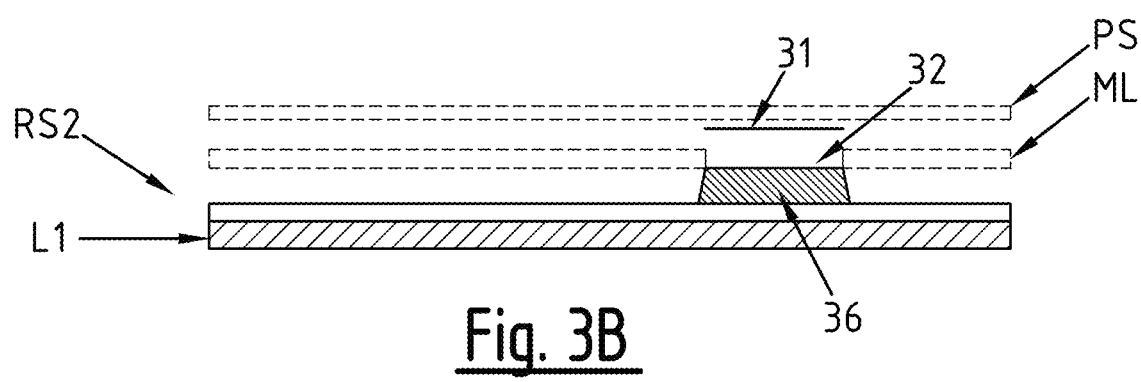

FIGS. 3, illustrate the improved one to one ratio may be better understood with FIGS. 3, in particular with the comparison between FIGS. 3A and 3B, wherein a relief structure RS1 made with a typical photosensitive composition is shown in FIG. 3A and a relief structure RS2 in accordance to the photosensitive composition as described herein is shown in FIG. 3B. Relief 36, shown in FIG. 3B, is more equal to the ablated pattern 32 on the mask layer ML, hence the printed area or printed pattern 31 on the printing substrate PS is more equal to the original pattern 32 which was created on the mask layer ML. Instead of a mask layer ML, a photographic mask may also be used. Due to the improved one to one ratio, the printed image 31 on the printing substrate PS is more equal to the original ablated pattern 32 on the mask layer ML, hence achieving more predictable results. In particular compared to the printed pattern 30, which was printed with relief 35 comprising a typical photosensitive composition. Such a typical relief structure RS1 typically shows a deviation between the original pattern OP and the printed pattern PP. FIG. 3A illustrates the case were the deviation is such that the transferred printed image 30 is smaller than the ablated original pattern 32.

Dimensionally Stable Carrier Layer L1

Preferably, the carrier layer L1 comprises a metal sheet, a steel, an alloy, a natural or artificial polymer, a polymer blend, a polymer film, or any combination thereof. Examples of suitable dimensionally stable carriers are plates, foils, and also conical and cylindrical tubes, known as sleeves, made of metals such as steel, aluminum, copper or nickel, or of plastics such as polyethylene terephthalate, polybutylene terephthalate, polyamide or polycarbonate, of wovens or nonwovens such as woven glass fiber fabric, or of composite materials composed of glass fibers and plastics. Particularly suitable as dimensionally stable carriers are dimensionally stable carrier foils or metal sheets, examples being polyethylene or polyester foils or steel or aluminum sheets. The carrier foils or metal sheets have a thickness, generally speaking, of 50 to 1500 μm, preferably 75 to 400 μm, for example around 250 μm. If steel is used as carrier material, steel sheets having a thickness of 0.05 to 0.3 mm are preferred. For protection against corrosion, preference is given to using tin-plated steel sheets. These carrier foils or carrier sheets may be coated with a thin, adhesion-promoting layer, for example a layer 0.1 μm to 2 μm thick, on the side of the carrier foil facing the radiation-curable, relief-forming layer. In a preferred embodiment, the carrier layer is a PET carrier layer made from polyethylene terephthalate.

Photosensitive Layer L2

Typically, at least the photosensitive layer L2 comprises the photosensitive composition as described herein. Preferably, photosensitive layer L2 has a thickness of in the range of 25 μm to 5000 μm, preferably 0.01 to 4 mm, more preferably 0.02 to 3 mm, and very preferably 0.03 mm to 3 mm. The photosensitive layer may comprise different sub-layers which comprise the components as described above for the photosensitive composition but the ingredients may be present in different concentrations and/or as different components. For example a sub-layer may comprise only non-ionic monomers whereas another sub-layer comprises ethylenically unsaturated compounds with ionic groups. In this manner, one can design a photosensitive layer with desired properties at certain points or heights in the photosensitive layer. For example, one can design a sub-layer which may comprise component E in a higher concentration than another sub-layer. The other sub-layer may be positioned above or below the sub-layer with a higher concentration of component E. It is to be understood that the term above is interpreted as closer to the surface of the printing plate and thus further away from the dimensionally stable carrier layer.

One or More Additional Layers

Optional additional layers OL may be positioned between layer L1 and L2, or may be positioned above L2 or both. Preferred examples of the additional layers include a barrier layer, a laser-ablatable mask layer, an adhesion layer, a release layer or a disbonding layer, UV/VIS light and/or IR light absorbing layer, a monomer diffusion control layer, a surface control layer, a protection layer, a cover foil, a cover film or combinations thereof.

In an embodiment, there may be an adhesion coating layer with an optional top coating layer thereon. Such adhesion coating layers may be, for example, layers of polyurethane adhesion coating materials, as described in DE3045516 for example. Such adhesion coating materials can be based on polyisocyanate-crosslinked polyether or polyester coating materials. The adhesion coating layer with an optional top coating layer can have a thicknesses of between 0.5 and 50 µm, more particularly between 2 and 30 µm. Top coating layers may be located on the side of the adhesion coating layer facing away from the carrier layer, and generally have layer thicknesses of between 0.1 and 50, more particularly 1 and 10, µm, and may be obtained, for example, by application of a dilute aqueous-alcoholic solution of part-hydrolyzed (hydrolyzed, for example, to an extent of 80%) polyvinyl ester, phenylglycerol ether monoacrylate (2-hydroxy-3-phenoxypropyl acrylate), and glyoxal, and by drying and baking of the top coating layer. The adhesion in the exposed or unexposed state between the dimensionally stable carrier layer and the photosensitive layer ought to be greater than 0.5 N/cm on measurement in a peel test at a peel angle of 90° with a peeling velocity of 30 mm/min.

As for example shown in FIG. 1, barrier layers OL or protective layers and/or cover layer CL may be present in the relief precursor RP in order to protect the photosensitive layer L2, which may also be called a radiation-curable and/or relief-forming layer. Typically, these layers provide protection from environmental effects such as, for example, light, moisture, oxygen or ozone. Additional or similar, barrier layers to protect against contamination and/or damage of the photosensitive layer during storage or manipulation may also be present. It is, however, also possible to unite different barrier layers with different properties in one layer. The barrier layer may be a separate barrier layer or may similar or equal to the carrier layer with corresponding barrier properties. Protective foils or barrier layers may consist of plastics which absorb and/or reflect corresponding wavelengths, for example, polyethylene naphthalate, absorbs in the UV range, other suitable materials for the protective barrier layers are described in in EP0504824 and EP0767406. Moisture barrier layers may be present and preferably consist of polymers which exhibit a low diffusion coefficient for water, such as for example polyethylenes, polypropylenes, polyesters, and polyvinyl alcohols.

Preferably, an oxygen barrier layer OL is present since a free radical polymerization reaction which, upon exposure, forms the polymer chains and/or polymer network is affected by the presence of oxygen. A growing polymer chain may react with the molecular oxygen, thereby producing an oxygen radical which can slow down the rate of propagation. Suitable materials for oxygen barrier layers are both water-soluble binders and binders soluble in organic solvents, these binders being polyamides, polyvinyl alcohols, hydroxyalkylcelluloses, ethylene-vinyl acetate copolymers, amphoteric interpolymers, cellulose acetate butyrate, alkylcellullose, butyral, cyclic rubbers, and combinations thereof. Preference is given to using polyvinyl alcohol, part-hydrolyzed and highly hydrolyzed polyvinyl carboxylate, poly(ethylene oxide-vinyl alcohol) graft copolymers or poly(ethylene vinyl alcohol) copolymers. The thickness of the barrier layer is in general 0.2 µm to 10 µm, preferably 0.3 to 8 µm.

Typically, a barrier layer OL is located in direct contact with the photosensitive or radiation-curable layer L1 and prevents unwanted low molecular weight substances or impurities from the environment to move, diffuse or transfer into the photosensitive layer. These impurities may be for example, moisture, oxygen, ozone or combinations thereof. Additionally or alternatively these impurities may be originating from other layers, for example dyes or UV absorbers. Also, the same or another a layer, may prevent low molecular weight substances, such as for example the initiators or monomers, from diffusing away from the photosensitive layer, into for example the layers which are situated nearby, such as the layers above. Other arrangements wherein a barrier layer is positioned elsewhere, or two or more barrier layers are employed, are likewise possible. Suitable barrier layers against moisture, light and oxygen are the barrier layers described above. Anti-diffusion barrier layers have a high diffusion resistance with respect to the migrating substances such as the initiators and monomers. Generally speaking, the barrier layers are at least partially water-soluble or water-dispersible.

Adhesion layers may be present which increase the adhesion between individual layers and stabilize the layer construction. Such layers comprise substances which exhibit an interaction with both bordering layers, these substances are for example surfactants, amphiphilic molecules having hydrophobic and hydrophilic regions, block copolymers, oligomers comprising blocks that are compatible with the two layers or with the polymers in the bordering layers.

One or more release layers may be present which reduce the adhesion between individual layers and facilitate, for example, the removal of another layer, for example by peeling. For example the removal of a protective foil, can be facilitated with a release layer. These layers may be located at any of a very wide variety of different positions in the layer construction, and may be used to ease the removal of one or more layers.

In an embodiment, a surface structure generating layer may be present and which is designed for generating a surface structure on the radiation-curable layer. This layer is usually located in direct contact with the radiation-curable layer, and is designed to influence the structure or roughness of the surface of said layer. Such a layer may be applied by embossing or impressing processes during the production of the layered assembly forming a relief precursor.

In an embodiment, the mask layer ML allows for the imagewise exposure of the radiation-curable layer L2 and comprises at least one material which absorbs and/or reflects the electromagnetic radiation used during the exposure of the relief precursor. Additionally, the mask layer comprises a material which allows the mask layer ML to be locally removed as a result of an imaging process controlled by, for example an energy source 1 as illustrated on FIG. 2A. Preferably, this energy source is a laser and ablates the mask layer ML away with a laser beam 11, creating an open area 32 as for example illustrated in FIG. 2A. In addition or alternatively, the mask layer can be modified in its absorption and/or reflection properties so that the layer becomes at least partially transparent to the electromagnetic radiation used during the exposure of the relief precursor. The mask layer may further comprise additional components such as binders and additives which ensure effective processability, film formation, and development. The mask layer is preferably a laser-ablative mask layer ML which can be removed by laser radiation 1, as a result of a high energy input 11, as for example illustrated on FIG. 2A. Laser removal is only taking place at the locations 32 where a laser beam 11 is or was directed on the mask layer. In this way, an image or pattern is created in the mask layer, which can later form an equal or similar image or pattern on the resulting relief structure. Successive exposure to electromagnetic radiation 2, such as shown in FIG. 2A, in the exposed regions 22 of the photosensitive layer L2 cause crosslinking and/or polymerization reaction in the layer L2. Afterwards, the mask layer ML and unexposed material of the photosensitive layer L2 are removed, as illustrated by the dashed lines in FIG. 2B, thereby creating a relief structure RS with a cured and/or polymerized relief 23 thereon. The mask layer is preferably ablated using infrared lasers, with a wavelength range of 700 nm or more, preferably 750 nm to 1 mm. And the successive exposure is carried out with electromagnetic radiation in the UV range. It is possible to apply pre and post exposure cycles. Suitable Laser-ablative mask layers are for example described in WO9403839, U.S. Pat. No. 5,262,275, WO9403838, and EP0767406. The laser-ablative mask layer generally comprises one or more water-soluble or water-dispersible binders, or binders that are soluble or dispersible in aqueous/alcoholic solvent mixtures, and comprise materials which absorbs IR light, or show strong absorption in the wavelength range from 750 to 20 000 nm, preferably from 750 to 5000 nm. The mask layer can comprise a plasticizer. The mask layer sensitive to IR light has an optical density with respect to actinic light of >2.5, preferably between 3 and 5. Examples of suitable binders for the mask layer are part-hydrolyzed polyvinyl esters, e.g., part-hydrolyzed polyvinyl acetates, polyvinyl alcohol derivatives, such as, for example, part-hydrolyzed vinyl acetate/alkylene oxide graft copolymer, maleic anhydride copolymers such as, for example, copolymers of maleic anhydride and isobutene or maleic anhydride and vinyl methyl ether, water-soluble polyesters, water-soluble polyethers, homo- and copolymers of vinylpyrrolidone, vinylcaprolactam, vinylimidazole, vinyl acetate, acrylamide, water-soluble polyurethanes, polyamides which are water-soluble or soluble in water-alcohol mixtures, or mixtures of these polymers. IR-absorbing material used may comprise dyes and/or pigments. As dyes it is possible for example to use phthalocyanines and substituted phthalocyanine derivatives, cyanine dyes and merocyanine dyes, or else polymethine dyes. Examples of pigments which can be used include carbon black, graphite, chromium oxide or iron oxides.

The IR-absorbing material in the ML is in general present in a weight concentration of 1 to 60 wt %, based on the total weight of the mask layer. In order to render the IR-light-sensitive mask layer opaque toward actinic light, it is possible to use any compounds which absorb UV light. Examples are the earlier mentioned dyes and pigments. The majority of initiators in photosensitive layers are sensitive toward UV light. Consequently, carbon black is frequently used as a pigment in the IR-light-sensitive layer. When carbon black is used as a pigment in the IR-light-sensitive layer, there is no need to use a further IR-absorbing material. The concentration of the material opaque to actinic light is selected such as to attain the necessary optical density. In general the optical density required is more than 2.5. When carbon black is used as pigment in the IR-light-sensitive layer, the amount used is around 1 to 60 wt %, preferably 1 to 40 wt %, based on the total weight of the IR-light-sensitive mask layer.

As outermost layer, the relief precursor in general comprises a protective layer, a cover layer or cover foil CL, preferably a protective foil or film, which protects the radiation-curable layer from mechanical damage, caused by scratches, dirt or dust, for example. This protective layer is typically removed before further processing steps. In general, the protective layer is a thin and preferably likewise dimensionally stable polymeric foil made of polyesters, e.g., polyethylene terephthalate or polybutylene terephthalate), polyamides, polyurethanes or polyethylene. To protect the radiation-curable layer from light, the protective layer may also comprise light-absorbing materials and may therefore prevent premature unwanted polymerization in the radiation-curable layer.

Method for Producing a Developable Relief Precursor (RP)

Further according to the invention, there is provided a method for producing a developable relief precursor. The method comprising the steps: —providing at least one dimensionally stable carrier layer; —optionally, providing an adhesive layer and/or an adhesive treatment on the dimensionally stable carrier layer; —providing a photosensitive composition on the at least one dimensionally stable carrier layer; —optionally, providing one or more additional layers and/or treatments; and the photosensitive composition is the inventive photosensitive composition, according to the invention as described herein which may have the components with corresponding features as described earlier. An exemplary embodiment of a produced relief precursor RP is illustrated on FIG. 1.

In a more detailed description this method comprises very generally, in the order a) to g), the steps of
 a) providing a carrier layer L1, such as a
 b) optionally cleaning the carrier,
 c) optionally applying one or more optional layers OL,
 d) applying at least one layer of the photosensitive composition L2,
 e) optionally further treating the layered assembly, preferably by drying,
 f) optionally applying one or more optional layers OL,
 g) optionally further treating the layer construction.

In step a) a dimensionally stable carrier is provided, which may additionally have been provided with optional layers (e.g., an adhesion promoter layer, a barrier layer, a coating layer).

In the optional step b), the surface of the carrier is cleaned, and is optionally coated with optional layers or directly with the photosensitive composition. In the cleaning operation, in particular, dust and foreign particles, but also surface soiling of a kind adversely affecting the adhesion (e.g., fingerprints), are removed. Here is it possible to employ all methods familiar to the skilled person, such as, for example, brushing, blowing off, wiping (with and without solvent), rinsing off, and any desired combinations thereof. Generally speaking, such cleaning is carried out.

In the optional step c), one or more optional layers may be applied, as for example an adhesion promoter layer or interlayer, a barrier layer or a coating layer, and also suitable combinations of these layers. The optional layers may be applied by any methods familiar to the skilled person, such as, for example, by calendaring, laminating, extruding, casting, dipping, spraying, coating or lining, and also suitable combinations thereof. Preferably in step c) a carrier foil or a carrier sheet is coated with an adhesion layer, which is baked or dried. It is also possible to use carrier films, preferably carrier films of polyethylene terephthalate, polybutylene terephthalate, polyamide and/or polycarbonate, which have a coating of an adhesion promoting layer.

In step d), at least one layer of the photosensitive composition is applied; other operating steps may be carried out between the application of two or more layers, such as, for example, drying, irradiating or spraying, and suitable combinations thereof. The photosensitive composition may be applied by any methods familiar to the skilled person, such as, for example, laminating, lining, casting, dipping, spraying, and suitable combinations thereof. It may be possible for the photosensitive composition and/or the layers to be heated or cooled. Depending on the method of application in step d), it may be necessary to carry out further treatments of the layer construction in step e). Especially if liquid or solvent-containing mixtures are applied, it may be preferred to carry out drying steps by heating of the layered assembly or evaporation of solvent under a reduced pressure, for example reduced in respect to 1 atm. It may also be possible to subject the layer construction to mechanical treatment, by means of rolls or presses, for example. Moreover, it may be advantageous to irradiate the layer construction at this stage from at least one side, which is correspondingly transparent, with electromagnetic waves.

The photosensitive composition is preferably applied by casting onto a dimensionally stable metal sheet, made more particularly of aluminum or steel, which comprises the one top coating layer, composed for example of dilute aqueous/alcoholic solution of part-hydrolyzed polyvinyl esters, phenyl glycerol ether monoacrylate, and glyoxal, or a dimensionally stable foil, preferably of PET, which has an adhesion layer composed of polyurethane adhesive coating material, in accordance, for example, with DE 3045516 A1, based on polyisocyanate-crosslinking polyether or polyester coating materials, and to dry the applied mixture in a drying tunnel by heating at 50 to 200° C. The thickness of the applied and optionally treated, photosensitive radiation-curable layer is generally from 0.01 to 5 mm, preferably 0.01 to 4 mm, more preferably 0.02 to 3 mm, and very preferably 0.03 mm to 3 mm.

In optional step f), one or more additional layers may be applied to the radiation-curable, relief-forming layer. Such layers may comprise a protective layer, a barrier layer, a mask layer, an adhesion layer, a release layer, a layer for generating a surface structure, and suitable combinations of these layers. The optional layer or layers may be applied by any methods familiar to the skilled person, such as, for example, by calendering, lining, laminating, rolling, extruding, casting, dipping, spraying, and suitable combinations thereof. Here as well it may be necessary to carry out further treatments of the layer construction. Particularly if liquid or solvent-containing mixtures are applied, it may be necessary to carry out drying steps by heating of the layer assembly or evaporation of the solvent under reduced pressure. Generally speaking, at least one protective layer, preferably a protective foil, is applied, its application taking place preferably by laminating or lining.

In one embodiment the photosensitive composition may be applied, for example by casting, to a carrier foil or protective foil, dried, and then laminated onto the metallic or polymeric carrier, in which case solvents may also be employed. It is also possible to apply the photosensitive composition to a carrier and to apply the optional layer to a foil and then to laminate the foil bearing to the optional layer onto the photosensitive composition. If any of the layers or the radiation-curable mixture have been heated in a preceding step, it may be advantageous to carry out active cooling of the layer structure formed. Optionally the layer construction in step g) may be subjected to further treatments which are advantageous for further processing. These include, for example, exposure to electromagnetic waves of at least one of the two sides of the layer structure, which is correspondingly transparent, an optical quality control for defects and/or impurities, cutting into predetermined formats, thermal treatment, packing, storage, and any desired combinations thereof. Optionally, one or more treatments are selected from the group comprising: surface treatments, adhesion treatments, corona treatment, flame treatment, chemical treatment plasma treatment, top surface coating treatment or combinations thereof.

The Method for the Manufacturing of a Relief Structure (RS)

The method comprising the steps: —providing a relief precursor comprising a the inventive photosensitive composition according to the invention as described herein; —exposing the photosensitive composition to electromagnetic radiation, preferably in an image wise fashion; —removing non-exposed areas with aid from a developing liquid.

Preferably, the exposing is done through an ablated mask layer and/or done through a mask arranged between the photosensitive layer L2 and the source of electromagnetic radiation 2, as for example illustrated in FIG. 2A. In general, the method comprises the following steps:

a) providing a relief precursor, comprising the photosensitive composition as described herein.
b) optionally cleaning a relief precursor,
c) optionally irradiating with electromagnetic radiation from a first side,
d) optionally removing a protective layer, e.g a cover layer,
e) optionally applying a mask,
f) imaging the mask layer, e.g by using laser ablation
g) irradiation with electromagnetic radiation through the ablatable mask layer and/or through a mask, e.g with electromagnetic radiation irradiating through an opening in the mask layer.
h) optionally removing the mask layer,
i) removing the non-irradiated regions,
j) optionally further treatment steps.

In the first step a) the relief precursor described is provided. It may optionally be cleaned in step b), in which case all of the methods familiar to the skilled person may be used, such as, for example, brushing, blowing off, wiping (with and without solvent), rinsing off, and any desired combinations thereof.

In the optional step c), the relief precursor is irradiated extensively from at least one side with electromagnetic radiation (see above). This irradiation takes place preferably from the side of the radiation-curable layer that is opposite the mask layer, in order to achieve anchoring of the relief structure to be generated (back-side exposure). This back-side exposure takes place preferably through transparent dimensionally stable materials such as, for example, polymer films, and especially polyester films, as carrier material.

Where a protective layer is present, it may be removed in the optional step d), and this may take place both mechanically and chemically by treatment with solvents, water or aqueous solutions. The protective layer is preferably a protective film or foil and is peeled off.

If the relief precursor contains no mask layer, this mask layer can be applied in the optional step e). The mask layer here may already have been imaged, in which case step f) is dispensed with. The mask is or can be a mask layer and may be applied by any methods known to the skilled person, such as, for example, placement, calendering, laminating, rolling, extruding, casting, dipping, spraying, lining, and suitable combinations thereof. Optionally, and particularly when applying liquid formulations, further treatment steps may be necessary, such as drying, rolling and/or cooling, for example. The mask layer is preferably placed on or laminated on the relief precursor.

The sequence of steps b), c), d), and e) may be varied in a suitable way.

In step f) the mask layer is imaged, and this step is optional only when in step e) an imaged mask layer is applied or the radiation-sensitive layer is exposed directly, as for example by means of guided laser beams or of positionally resolved projection of electromagnetic radiation. The mask layer is imaged either by removal of the layer and/or by positionally resolved alteration in the absorption and/or reflection properties, such that the mask layer becomes at least partially transparent in the wavelength range used for the imaging. Preference is given to using a mask layer which can be ablated by means of IR lasers.

In step g) the relief precursor is irradiated with electromagnetic radiation from the side of the radiation-sensitive layer that is opposite the dimensionally stable material, and the radiation-induced polymerization and crosslinking reaction is set in train. Where an imaged mask is present, irradiation may take place extensively, or, if operating without a mask layer, irradiation may take place in an imaging way over a small area (virtually dotwise) by means of guided laser beams or positionally resolved projection of electromagnetic radiation. The wavelength of the electromagnetic waves irradiated in this case is in the range from 200 to 2000 nm, preferably in the range from 200 to 450 nm, more preferably in the range form 250 nm to 405 nm. The irradiation may take place continuously or in pulsed form or in a plurality of short periods with continuous radiation. In addition to broadband radiation of the electromagnetic waves it may be advantageous to use narrow-band or monochromatic wavelength ranges, as can be generated using appropriate filters, lasers or light-emitting diodes (LEDs). In these cases, wavelengths in the ranges 350, 365, 385, 395, 400, 405, 532, 830, 1064 nm individually (and about 5-10 nm above and/or below) or as combinations are preferred. The intensity of the radiation here may be varied over a wide range, ensuring that a dose is used which is sufficient to cure the radiation-curable layer sufficiently for the later development procedure. The radiation-induced reaction, possibly after further thermal treatments, must be sufficiently advanced that the exposed regions of the radiation-sensitive layer become at least partially insoluble and therefore cannot be removed in the developing step. The intensity and dose of the radiation are dependent on the reactivity of the formulation and on the duration and efficiency of the developing. The intensity of the radiation is in the range from 1 to 15 000 mW/cm2, preferably in the range from 5 to 5000 mW/cm2, more preferably in the range from 10 to 1000 mW/cm2. The dose of the radiation is in a range from 0.3 to 6000 J/cm2, preferably in a range from 3 to 100 J/cm2, more preferably in the range from 6 to 20 J/cm2. Exposure to the energy source may also be carried out in an inert atmosphere, such as in noble gases, CO2 and/or nitrogen, or under a liquid which does not damage relief precursor.

In step h), optionally, the mask layer may be removed, and this may be done both mechanically and chemically by treatment with solvents, water, or aqueous solutions. Separate removal of the mask layer is appropriate especially when the layer as a whole can be peeled off mechanically, or if the mask layer has merely been placed on or laminated on. If one is operating without a mask layer, this step is redundant.

To generate the relief structure, in step i) the regions of the radiation-curable layer not exposed in step g) are removed. In this developing step, all methods familiar to the skilled person may be employed. The irradiation brings about polymerization and/or crosslinking in the radiation-curable layer, causing it to become less soluble. To remove the unexposed regions, solvents, water and/or aqueous solutions or combinations thereof are preferably used as developing liquid. The solvents and aqueous solutions may comprise auxiliaries which stabilize the formulation and/or which increase the solubility of the components of the radiation-curable layer. Examples of such auxiliaries are emulsifiers, surfactants, salts, acids, bases, stabilizers, corrosion inhibitors, and suitable combinations thereof. Development with these solutions may take place using all of the methods known to the skilled person, such as, for example, dipping, washing or spraying with the developing medium, brushing in the presence of developing medium, and suitable combinations thereof. Development is carried out preferably using neutral aqueous solutions or water, with removal being assisted by brushes or a plush web. Another way of influencing the development is to control the temperature of the developing medium and to accelerate development by raising the temperature, for example. In this step it is also possible for optional layers still present on the radiation-sensitive layer to be removed, if these layers can be detached during developing and sufficiently dissolved and/or dispersed in the developer medium.

The preceding steps may optionally be followed by further treatment steps (step j). These include, for example, a thermal treatment, drying, treatment with electromagnetic radiation, attachment of identification features, trimming, coating, and any desired combinations thereof. A thermal treatment may be utilized, for example, to initiate and/or to complete reactions, to increase the mechanical and/or thermal integrity of the relief structure, and to remove volatile constituents. For the thermal treatment it is possible to use the known methods, such as, for example, heating by means of heated gases or liquids, IR radiation, and any desired combinations thereof. Here it is possible for ovens, fans, lamps, and any desired combinations thereof and to be employed. Additional treatment with electromagnetic radiation may be used, for example, to make the surfaces of the relief structure tack-free, or to trigger and/or to complete the polymerization and/or crosslinking reactions. The wavelength of the irradiated electromagnetic waves in this case is in the range from 200 to 2000 nm as already described above.

By having the inventive photosensitive composition comprised in the relief precursor used in the method for the manufacturing of the relief structure, less chemicals are transferred into the developing liquid so that the developing liquid has an AOX value equal or lower than 3.2 mg/L, preferably lower than 3 mg/L, more preferably equal or lower than 2.8 mg/L, most preferably equal or lower than 2.6 mg/L. The AOX value is determined according to the method as described in example 2 of the description.

The method according to the invention typically comprises washout times equal or lower than 4 min, preferably equal or lower than 3.5 min, most preferably equal or lower than 3 min.

Another method for producing a relief structure comprises irradiating the relief-forming layer and engraving a relief into irradiated, cured regions of the relief-forming layer. Such a method seems especially suited for the formation of pad printing plates. Very generally this method comprises the following steps:

a) providing the relief precursor,
    b) optionally cleaning the relief precursor,
    c) optionally irradiating with electromagnetic radiation from the back side,
    d) optionally removing a protective layer,
    e) irradiating the radiation-curable layer with electromagnetic radiation,
    f) image wise-ablating at least a part of the radiation-curable layer,
    g) optionally further treatment steps.

In the first step a) the relief precursor is provided. It may optionally be cleaned in step b), in which case all of the methods familiar to the skilled person may be used, such as, for example, brushing, blowing off, wiping (with and without solvent), rinsing off, and any desired combinations thereof. In the optional step c), the relief precursor may be irradiated extensively from the back side with electromagnetic waves if this side of the relief precursor is transparent for the wavelengths used. This irradiation takes place from the side of the radiation-sensitive layer that is opposite the mask layer, in order to achieve anchoring of the relief structure to be generated (back-side exposure). This back-side exposure takes place preferably through transparent dimensionally stable materials such as, for example, polymer films, and especially polyester films. The wavelength of the irradiated electromagnetic waves here is in the range from 200 to 2000 nm, as already described above.

Where a protective layer is present, it may be removed in the optional step d), and this may take place both mechanically and chemically by treatment with solvents, water or aqueous solutions. The protective layer is preferably peeled off.

The sequence of steps b), c), and d) may be varied here in any desired way. In step e) the layer structure is irradiated with electromagnetic waves from the side of the radiation-sensitive layer that is opposite the dimensionally stable material, and the radiation-induced reaction is set in train. Irradiation may take place extensively, or else, irradiation may take place in an imaging way over a small area (virtually dotwise) by means of guided laser beams or by projection of electromagnetic radiation. The wavelength of the electromagnetic waves irradiated in this case is in the range from 200 to 2000 nm, as already described above. The irradiation here may take place continuously or in pulsed form or in a plurality of short periods with continuous radiation. The intensity of the radiation here may be varied over a wide range, ensuring that a dose is used which is sufficient to modify the radiation-sensitive layer sufficiently for the later use. The radiation-induced reaction, possibly after further thermal treatments, must be sufficiently advanced that the exposed regions of the radiation-sensitive layer are stable. The intensity and dose of the radiation are dependent on the reactivity of the formulation and on the aggressiveness of the developing. The intensity of the radiation is in the range from 1 to 15 000 mW/cm2, preferably in the range from 5 to 5000 mW/cm2, more preferably in the range from 10 to 1000 mW/cm2. The dose of the radiation is in a range from 0.3 to 6000 J/cm2, preferably in a range from 3 to 100 J/cm2, more preferably in the range from 6 to 20 J/cm2. Exposure to the energy source may also be carried out in an inert atmosphere, such as in noble gases, CO2 and/or nitrogen, or under a liquid which does not damage the relief precursor. The relief structure is completed in step f) by image wise ablation of at least a part of the radiation-sensitive layer. This can be done by means of mechanical methods or by ablation using high-energy radiation. In the case of the mechanical methods, specific regions of the radiation-sensitive layer are removed with at least one tool, and in this way imaging is achieved. The tools can be controlled using computer-assisted processes. In the case of ablation with high-energy radiation, beams are guided under computer assistance over the radiation-sensitive layer and the material is removed in the irradiated region. The wavelength of the irradiated electromagnetic waves in this case is in the range from 500 nm to 100 μm, preferably in the IR range, more preferably in the range from 500 nm to 50 μm, very preferably in the range from 800 nm to 20 μm. As well as broad-spectrum irradiation of the electromagnetic waves, it may be advantageous to use narrow-spectrum or monochromatic wavelength ranges, of the kind which can be generated using low-pressure, high-pressure, fluorescent and/or flash lamps with corresponding filters, lasers or light-emitting diodes (LEDs). In these cases, wavelengths in the regions of 830 nm, 980 nm, 1064 nm, and 10.6 μm, individually or as combinations, are preferred. Preference is given to using LEDs and fluorescent lamps or fluorescent tubes and combining them arbitrarily with one another.

The depth of relief achievable with this process is limited upwardly by the layer thickness of the applied radiation-sensitive layer and is in the range from 10 to 1000 μm, preferably in the range from 20 to 500 μm, more preferably in the range from 30 to 100 μm. The preceding steps may optionally be followed by further treatment steps (step j). These include, for example, a thermal treatment, drying, treatment with electromagnetic radiation, attachment of identification features, trimming, coating, and any desired combinations thereof. A thermal treatment may be utilized, for example, to initiate and/or to complete reactions, to increase the mechanical and/or thermal integrity of the relief structure, and to remove volatile constituents. For the thermal treatment it is possible to use the known methods, such as, for example, heating by means of heated gases or liquids, IR radiation, and any desired combinations thereof. Here it is possible for ovens, fans, lamps, and any desired combinations thereof and to be employed.

Treatment with electromagnetic radiation may be used, for example, to make the surfaces of the relief structure tack-free, or to trigger and/or to complete the polymerization and/or crosslinking reactions. The wavelength of the irradiated electromagnetic waves in this case is in the range from 200 to 2000 nm as already described above.

EXAMPLES

The invention described above is further illustrated by the following examples, which are not intended to be construed in any way as imposing limitations upon the scope of the invention disclosures or claims attached herewith. On the contrary, it is to be understood the examples shown below are present in the description to give the skilled person a better understanding of the invention.

Example 1

In this example, it is demonstrated that ethylenically unsaturated monomers, as component E, which comprise an ionic group according to the invention, achieve improved AOX values or EOX values or both. The AOX values are demonstrated in in table 1.

TABLE 1

| Ethylenically unsaturated monomer | Comparative HPPE | Comparative BHPD | Inventive TMAEMC | Inventive MAPTAC | Inventive ADAMQUAT | Inventive Na-AMPS |
|---|---|---|---|---|---|---|
| Solid Content (%) | >99% | >99% | 75% | 50% | 80% | 50% |

TABLE 1-continued

| Ethylenically unsaturated monomer | Comparative HPPE | Comparative BHPD | Inventive TMAEMC | Inventive MAPTAC | Inventive ADAMQUAT | Inventive Na-AMPS |
|---|---|---|---|---|---|---|
| AOX (in mg/L) | 4600 | 2600 | <50 | <10 | <50 | <10 |

(HPPE) and (BHPD) comprise 2-hydroxy-3-phenoxypropyl prop-2-enoate and 1,4-butanediylbis[oxy(2-hydroxy-3,1-propanediyl)] diacrylate respectively and represent typically used acrylates in the industry as a comparative example, such components are not carrying ionic groups and represent component EM.

TMAEMC, MAPTAC, ADAMQUAT, Na-AMPS carry an ionic group and represent component E of the invention.

Indeed, the selected ethylenically unsaturated monomers result in more desirable AOX values and/or EOX values. These values have been measured or determined according to the measurement methods as described further herein.

Measurement of AOX of Ethylenically Unsaturated Monomers (Component E)

The AOX value of the ethylenically unsaturated monomer, as component E, was measured for the monomer samples in aqueous solution with the respective solid contents as listed in table 1. This value was determined as follows: AOX was measured according to the 'DIN EN ISO 9562' norm (following 6.2.1.). If the concentration of dissolved anions of the sample was above 1000 mg/kg, as determined according to the 'DIN EN ISO 10304-1' norm, then the sample was diluted prior to analysis using water, grade 1 as specified in ISO 3696:1987, to achieve a concentration of dissolved anions below 1000 mg/kg, as determined according to the 'DIN EN ISO 10304-1' norm. In this case, the AOX value was back-calculated to an undiluted sample, and was then listed in table 1.

Measurement of AOX of Ethylenically Unsaturated Compound (Component EM)

The AOX value of the ethylenically unsaturated monomer, not comprising an ionic group as component EM, was measured in a similar way as described earlier for component E.

Measurement of EOX of Ethylenically Unsaturated Monomers (Component E and EM)

EOX of the ethylenically unsaturated components was measured as follows: EOX was measured according to the 'DIN 38414-17' norm using i-hexane as solvent. A similar trend as with the AOX values was observed.

Example 2

In this example, it is shown the relief precursor and relief structure comprising the photosensitive composition as described herein achieve improved properties. Namely, regarding the cumbersome curling phenomena, the inventive composition cause a beneficial effect on the curling by reducing the undesired curling of the side edges. Further, it is shown that improved dot sizes with less deviation, higher flexibility, longer run lengths and improved AOX values are achieved with the inventive formulation as described herein.

TABLE 2

| | Sample | | | | | | |
|---|---|---|---|---|---|---|---|
| | 2a | 2b | 2c | 2d | 2e | 2f | 2g |
| Monomer amount (pbw) | 28 pbw HPPE | 23 pbw HPPE 5 pbw TMAEMC | 18 pbw HPPE 10 pbw TMAEMC | 13 pbw HPPE 15 pbw TMAEMC | 8 pbw HPPE 20 pbw TMAEMC | 18 pbw HPPE 10 pbw ADAMQUAT | 18 pbw HPPE 10 pbw Na-AMPS |
| Monomer concentration (wt %) | EM 11.8 wt % | EM 9.7 wt % E 2.1 wt % | EM 7.6 wt % E 4.2 wt % | EM 5.5 wt % E 6.3 wt% | EM 3.4 wt % E 8.4 wt% | EM 7.6 wt % E 4.2 wt % | EM 7.6 wt % E 4.2 wt % |
| Curling precursor (mm) | 46 | 52 | 49 | 39 | 32 | | |
| Curling relief structure (mm) | 40 | 35 | 32 | 24 | 22 | 23 | 17 |
| Minimum. developing time (min) | 4.0 | 3.5 | 3.5 | 3.0 | 3.0 | 3.5 | 3.5 |
| Dot diameter (μm) | 19 | 21 | 22 | 25 | 26 | 22 | 22 |
| Diameter difference (%) | −14% | −5% | 0% | 14% | 18% | 0% | 0% |
| Tensile stress at 50% strain σ50 (N/mm$^2$) | 4.9 | 4.0 | 3.8 | 2.6 | n.m. | 3.6 | n.m. |
| AOX of printing plate precursor (mg/L) | 3.2 | 2.6 | 2.1 | 1.5 (n.m.) | 1.0 (n.m.) | 2.2 (n.m.) | 2.8 |
| Run length when cracking starts | (−) | (0) | (+) | (+) | (+) | (+) | (+) |

To produce photopolymerizable printing plates samples, the following procedure is performed. First a photosensitive composition was prepared with the following constituents:

24 parts by weight of a functionalized copolymer was added as component B. The preparation of this functionalized copolymer is further described below. 21.84 parts by weight of partially-hydrolyzed polyvinyl acetate having a degree of hydrolysis 88% and a viscosity of 3 mPas, as component B.

21.84 parts by weight of a hydrogen bond forming additive, polyvinyl alcohol/polyethylene glycol graft copolymer, as a component B. This component was obtained by grafting vinyl acetate onto polyethylene glycol with molecular weights between 1000 and 50 000 and subsequently hydrolyzing to a degree of hydrolysis of 97% and a viscosity of 5 mPas, as measured with in a falling ball viscometer according to DIN 53 015 at 20° C. The grafting of vinyl acetate onto polyethylene was done as described in for example DE2846647A1.

The constituents above were dissolved in a mixture of 87 parts by weight of water and 53 parts by weight of n-propanol at a temperature of 85° C. and the solution was stirred until it was homogeneous.

Subsequently, 28 parts by weight of ethylenically unsaturated compound, 2-hydroxy-3-phenoxypropyl prop-2-enoate (HPPE) was added as component EM.

Next, the following was added to the solution:

1.5 parts by weight of initiator, benzil dimethyl ketal, was added as component P. Together with further additives were added as components A: 0.3 parts by weight of thermal inhibitor, N-nitrosocyclohexylhydroxylamine, potassium salt, 0.01 parts by weight of safranin T (C.I. 50240) as a dye, and 0.25 parts by weight of surface additive BYK 370 (BYK-Chemie GmbH).

The solution was stirred at a temperature of 85° C. until it was homogeneous.

This photosensitive solution was then cast onto a dimensionally stable protective cover film which was precoated beforehand with a laser-ablatable mask layer having a layer thickness of 3.2 µm, comprising a polymeric binder and carbon black. This precoated cover film with the laser-ablatable mask layer was obtained as follows. First of all a solution was prepared from 91 kg of toluene, 91 kg n-propanol, and 23 kg of benzyl alcohol. This solvent mixture was then heated to 70° C. Then, 23.4 kg of a soft elastic polyamide with a glass transition temperature of 5° C., a softening point of 135 to 145° C. and a melt flow index of 10 g/min, was added to this solution. Subsequently, a total of 12.6 kg of carbon black (with average particle size of 25 nm, BET of 180 m$^2$/g) was added in 4 portions with stirring (one portion of 3.15 kg per hour). After the last portion was added, the dispersion was stirred at 70° C. for 24 h and then cooled to 30° C. Thereafter the reaction batch was milled for 5 h with a stirred ball mill at 240 kg/h throughput, and filtered through a 10 µm filter. The reaction solution was briefly stirred and then applied with a wet application of 130 µm at a speed of 6.3 m/min to a PET film, with a layer thickness of 125 mm. The dry film thickness of the applied laser ablatable layer was 3.2 µm, obtained via gravimetric measurements.

After casting, the casted photosensitive solution with the PET film and the mask layer were then laminated using water and n-propanol, with a ratio 1:1, onto a dimensionally stable carrier layer. For the latter, a PET layer coated with an adhesion layer with a thickness of 250 µm was used. The resulting laminated layers, had a total thickness of 1100 µm and measured 12 by 12 cm. The plates were dried in a drying cabinet at 60° C. for three hours.

The functionalized copolymer, mentioned above, was a functionalized polyvinyl acetate and was prepared in accordance with DE3322994. For this, 50 parts by weight of a part-hydrolyzed polyvinyl acetate (degree of hydrolysis 82 mol %, average molecular weight 30 000 g/mol) were suspended in 150 parts by weight of toluene and then admixed with 8 parts by weight of methacrylic anhydride, 0.4 part by weight of methylimidazole and 0.05 part by weight of Kerobit TBK. The inhomogeneous reaction mixture was stirred at 85° C. for 5 h, after which the reaction product was separated off, washed with toluene and dried at 50° C. for 12 hours in a drying cabinet resulting in a copolymer composition with 3.4 mol % vinyl(meth)acrylic acid units, 81.0 mol % vinyl alcohol units and 15.6 mol % vinyl acetate units.

The relief precursor as sample 2a was created as described above. The photosensitive compositions of samples 2b-g were prepared as described above for sample 2a, with the difference that the first ethylenically unsaturated compound HPPE, as component EM, was partially exchanged with a second ethylenically unsaturated compound, as component E, which comprises an ionic group according to the invention. Thereby, creating the samples 2b-2g with amounts of component E as listed in table 2.

For all the samples, the following determinations were made.

Determination of Washout Time (Min)

The washout time is expressed as minimum developing time (min) in table 2. This value is determined by the following method. Unexposed relief precursor plates had their protective cover film removed and were washed using water, assisted by brushes, in a Nyloprint® Combi CW 35×50 (Flint Group) until the laser ablatable mask layer and the photosensitive layer were completely removed. The minimum time required to achieve a full removal of the photosensitive layer was reported as the washout time in minutes.

Measurement of the Curling of the Precursor (Mm)

The relief precursor plates that were not subjected to laser ablation, nor subjected to exposure or washout, were stored, with the carrier layer facing downwards, at room temperature (19-22° C.) for 2 days without a protective cover film. During this storage-time, the 4 corners of the relief precursor plates curled upward, as for example illustrated in FIGS. 4A and 4B. The distance was measured at the 2 corners showing the most curl, the arithmetic mean of these two measurement values was reported in mm. The distance can be understood as the distance between the surface on which the relief precursor is resting and the respective curled up corner of the relief precursor as for example shown in FIG. 4B, wherein the surface 40, the relief precursor RP and the measured distance d are shown.

Determination of a Suitable Exposure Time (4 Min)

A suitable exposure time was determined according to the following method. The relief precursor plates had their protective cover film layer removed. The laser-ablatable mask layer was ablated with a ThermoFlexx 20 (Xeikon) software Multiplate Version 3.1.0.48 and the following parameters: wavelength 1064 nm, 10 revolutions per second, 22 W laser power. During the laser ablation, a typically used test motif was imaged on the mask layer using a resolution of 2540 dpi. The test motif included a halftone wedge-like area with graduated tonal values (0.4% to 2.0% halftone fields with increments of 0.4%) with a resolution of 146 lines per inch (lpi). The ablated precursors were then exposed for different times using a Nyloprint® Combi CW 35×50 (Flint Group), equipped with TL 09 tubes. Then, after washout with a Nyloprint® Combi CW 35×50 (Flint Group) using water, assisted by brushes, and after subsequent drying at 65° C. for 15 minutes, a determination was made of the exposure time for which the 2% halftone screen (146 lines per inch (lpi)) can be reproduced without error. In these examples, an exposure time of 4 minutes was found and used for the examples listed in table 2.

Measurement of the Curling of the Relief Structure (Mm)

The curling of the relief structure was determined for relief structure plates measuring 12 by 12 cm. For this, relief precursor plates had their protective cover film layer removed. The laser ablatable mask layer was fully ablated with a ThermoFlexx 20 (Xeikon) software Multiplate Version 3.1.0.48 and the following parameters: wavelength 1064 nm, 10 revolutions per second, 22 W laser power. The plates with the now fully removed laser-ablatable mask layer were exposed using a Nyloprint® Combi CW 35×50 (Flint Group), equipped with TL 09 tubes, for 4 minutes. After the exposure, each of the plates were subjected to a washout with removal being assisted by brushes for a corresponding washout time period listed as min. developing time (min) in table 2. The washout was done with water. Afterwards, the relief structure was dried at 65° C. for 15 minutes in a Nyloprint® Combi CW 35×50 (Flint Group) dryer. Next, the plates were stored, with the carrier layer facing downwards and the exposed photosensitive layer facing upwards. This storage was done at room temperature (19-22° C.) for 2 days. During this time, the 4 corners of the plates curled upward. The distance was measured at the 2 corners showing the most curl, the arithmetic mean of these two measurement values was reported in mm. The distance can be understood as the distance between the surface on which the relief structure is resting and the respective curled up corner of the relief structure.

Measurement of the Dot Diameter (μm) and Diameter Difference (%)

The dot diameter which can be created on the relief structure was aimed to be 22 μm. This target and/or diameter was determined as follows. The relief precursor plates had their protective cover film layer removed. The laser ablatable mask layer was ablated with a ThermoFlexx 20 (Xeikon) software Multiplate Version 3.1.0.48 and the following parameters: wavelength 1064 nm, 10 revolutions per second, 22 W laser power. During the laser ablation, a typically used test motif was imaged on the mask layer using a resolution of 2540 dpi. The test motif included a halftone wedge-like area with graduated tonal values (0.4% to 2.0% halftone fields with increments of 0.4%) with a resolution of 146 lines per inch (lpi). After the test motif was formed with the laser ablation, exposure, washout and drying was done as described earlier. Next, the tonal value and diameter of the dots formed in the areas on the relief structure corresponding to halftone fields of the test motif (0.4% to 2.0% halftone field with increments of 0.4%) were measured using a Vipflex 334 and the "PlateQuality Flexo" software (Version 1.2.1.11). The following parameters were used: platetyp "Flexoplatten", color-contrast was set to "auto", and the fuzzy-restrictive algorithm was set to setting 4. The average diameter of 50 automatically evaluated dots were reported for the 1,2% tonal value, and listed in table 2 as "Dot diameter (μm)". The ideal theoretical value was 22 μm, a reported value closer to this ideal value shows more precision and predictability, thus a smaller deviation is preferred. This deviation value represents the deviation of the achieved and measured diameter of the dots formed on the photosensitive layer, said values are reported for each sample in table 2 as "diameter difference (%)".

Measurement of Tensile Stress at 50% Strain (N/Mm$^2$)

The flexibility of the relief structures were examined by measuring the tensile stress at 50% strain (σ50 in N/mm$^2$) value as determined via stress-strain measurements. The relief precursor plates had their protective cover film layer and carrier layer removed, by peeling off those layers. It should be ensured here that there are no instances of damage (cracks etc.) and/or foreign bodies (e.g., air bubbles, particles, etc.) present in the samples. The precursor samples were exposed (from the top) with the laser ablatable mask layer facing downwards using a Nyloprint® Combi CW 35×50 (Flint Group), equipped with TL 09 tubes, for 4 minutes. After this exposure, the sample plates were subjected to a washout with removal of the laser ablatable mask layer being assisted by brushes, each for the corresponding washout time period listed as "min. developing time (min)" in table 2. The washout was done with water. Afterwards, the relief structures were dried at 65° C. for 15 minutes in a Nyloprint® Combi CW 35×50 (Flint Group) dryer. After drying, the plates were stored at room temperature overnight and for each sample, 4 specimens were punched out of the relief structure plate wherein said specimens had a shape according to the ISO 527-2 standard, also defined as a Zwick specimen form 5A from Zwick Roell AG. Measurements were carried out using a Zwick Roell 72.5 instrument from Zwick Roell AG and the testexpert software version V10.0, according to a method based on DIN 53504, with a pre-tensioning force of 0.01 MPa and a strain rate of 100 mm/min at room temperature (around 20° C.). For the each of the samples, the tensile stress at 50% strain of the 4 punched out specimens were measured. The arithmetic mean of the measured the tensile stresses for each sample are reported in table 2 as "tensile stress at 50% strain (σ50) in N/mm$^2$".

Measurement of AOX of the Printing Plate Precursor in Mg/L

Environmental influence was examined by measuring the AOX values. These values were determined as follows. A 5×5 cm unirradiated relief precursor plate without a cover film, but with the laser ablatable mask layer, was weighed and then fully submerged in 500 mL water representing the developing liquid. Ultra-sonification was used to achieve a quicker dissolvement of the photosensitive layer. After the dissolvement of the photosensitive layer, the undissolved remaining of the relief precursor was dried and measured. The difference of weight before and after was between 3.6 g to 4.9 g. Normalization was done so that for each sample 2.5 g/L was achieved. AOX was measured according to the 'DIN EN ISO 9562' norm (following 6.2.1.). If the concentration of dissolved anions of the sample was above 1000 mg/kg, as determined according to the 'DIN EN ISO 10304-1' norm, the sample was diluted prior to analysis using water, grade 1 as specified in ISO 3696:1987, to achieve a concentration of dissolved anions below 1000 mg/kg, as determined according to the 'DIN EN ISO 10304-1' norm. In this case, the AOX value was back-calculated to an undiluted sample.

Measurement of the Run Length when Cracking Starts

The run length when cracking starts is measured as follows. A printing test was carried out using a UV letterpress ink, UVONOVA (Flint Group). For this test, the printing plates were stretched onto a printing cylinder and printed on a conventional letterpress unit (printing machine: Nilpeter-F 2400). The print substrate was "FSC" paper with one-side coating from Avery Dennison. The printing speed was 50 m/min. The size of the halftone screen was 146 lpi. Measurements were made of the tonal-value gain (1% to 10% halftone field) of the characteristic print lines in relation to the ideal tonal value original (1:1 curve). The results of the printing test are compiled in Table 2. After printing, the printing plates were inspected for cracks in the solid areas. The run length has been determined for multiple test runs. In said multiple test runs parameters such as the printing speed, printing pressure, hardness of the substrate to be printed on have been altered. For each sample one of the following values have been given (−), (0), (+) representing the average run length achieved by each sample during the multiple test runs. Herein, (−), represents smaller run lengths, implying more maintenance and/or replacement of the relief structure. The value (0), implies that longer run lengths can be achieved although with less significance. The value (+) illustrates a significant improvement in run length.

The invention claimed is:

1. A developable relief precursor, comprising:
a dimensionally stable carrier layer as layer L1,
at least one photosensitive layer as layer L2, and
optionally, one or more additional layers, wherein layer L2 comprises a photosensitive composition, wherein the photosensitive composition comprises:
at least one ethylenically unsaturated monomer as component E,
at least one photoinitiator or photoinitiator system as component P,
at least one water soluble binder as component B, and
optionally, one or more additives as component A,
wherein component E comprises at least one ionic group, and component E is present in an amount of 0.1 to 30 wt %, based on the total weight of the photosensitive composition;
wherein the water soluble binder is present in the range of 30 to 90 wt %, based on the total weight of the photosensitive composition; and
wherein component E is chosen from trimethylammonium ethyl methacrylate chloride (TMAEMC), 3-Methacrylamido-N,N,N-trimethylpropan-1-aminium chloride (MAPTAC), acryloxy ethyl tri methyl ammonium chloride (ADAMQUAT), a sodium salt of 2-acrylamido-2-methylpropane sulfonic acid (Na-AMPS), trimethyl({2-[(2-methylprop-2-enoyl)oxy]ethyl})azanium methyl sulfate (DMAEMDMS), or 3-sulfopropyl acrylate potassium salt (PSPA).

2. The relief precursor according to claim 1, wherein the relief precursor has an AOX value of less than 3.2 mg/L.

3. The relief precursor according to claim 1, wherein layer L2 has a thickness of in the range of 25 μm to 5000 μm.

4. The relief precursor according to claim 1, wherein layer L1 comprises a metal sheet, a steel, an alloy, a natural or artificial polymer, a polymer blend, a polymer film, or any combination thereof.

5. A method for producing a developable relief precursor comprising the steps:
providing at least one dimensionally stable carrier layer;
optionally, providing an adhesive layer and/or an adhesive treatment on the dimensionally stable carrier layer;
providing a photosensitive composition on the at least one dimensionally stable carrier layer; and
optionally, providing one or more additional layers and/or treatments;
wherein the photosensitive composition comprises
at least one ethylenically unsaturated monomer as component E,
at least one photoinitiator or photoinitiator system as component P,
at least one water soluble binder as component B, and
optionally, one or more additives as component A,
wherein component E comprises at least one ionic group, and component E is present in an amount of 0.1 to 30 wt %, based on the total weight of the photosensitive composition;
wherein the water soluble binder is present in the range of 30 to 90 wt %, based on the total weight of the photosensitive composition; and
wherein component E is chosen from trimethylammonium ethyl methacrylate chloride (TMAEMC), 3-Methacrylamido-N,N,N-trimethylpropan-1-aminium chloride (MAPTAC), acryloxy ethyl tri methyl ammonium chloride (ADAMQUAT), a sodium salt of 2-acrylamido-2-methylpropane sulfonic acid (Na-AMPS), trimethyl({2-[(2-methylprop-2-enoyl)oxy]ethyl})azanium methyl sulfate (DMAEMDMS), or 3-sulfopropyl acrylate potassium salt (PSPA).

6. A method for the manufacturing of a relief structure, comprising the steps:
providing a relief precursor as defined in claim 1;
exposing the photosensitive composition to electromagnetic radiation; and
removing non-exposed areas with aid from a developing liquid.

7. A relief structure obtained according to the method of claim 6, wherein:
the relief structure has an AOX value of less than 3 mg/L, and/or—the relief structure has a curling value that is lower than 4 mm.

8. The developable relief precursor according to claim 1, wherein component E is present in an amount of 0.5 to 20 wt %, based on the total weight of the photosensitive composition.

9. The developable relief precursor according to claim 1, wherein component E has a solubility in water equal or above 200 g/l, at 20° C., 1 atm and in water with a pH of 7.

10. The developable relief precursor according to claim 1, wherein component E has a molecular weight in the range of 100 to 1000 g/mol.

11. The developable relief precursor according to claim 1, wherein component E has a vapor pressure, and said vapor pressure is below 50 hPa at 25° C., wherein the vapor pressure is determined according to the ASTM E1194-17 norm for vapor pressures below 1 Pa and according to the ASTM D2879-18 norm for vapor pressured at or above 1 Pa.

12. The developable relief precursor according to claim 1, wherein component E has an AOX value lower than 2600 mg/L.

13. The developable relief precursor according to claim 1, further comprising an ethylenically unsaturated compound as component EM, wherein said component EM does not carry an ionic group.

14. The developable relief precursor according to claim 13, wherein component EM is present in an amount of 0.5 to 50 wt %, based on the total weight of the photosensitive composition and wherein the ratio of EM/E is between 0.1 and 10.

15. The developable relief precursor according to claim 1, wherein the photosensitive composition further comprises a counter ion as component I.

16. The developable relief precursor according to claim 15, wherein component I is selected from chloride, bromide, iodide, fluoride, sulfonate, methyl sulfate, sulfate, tosylate, nitrate, a halogen anion, a sulfonium anion, a tosylate anion, a borate anion, a nitrate anion, a methyl sulfate anion, halogen anion, or combinations thereof; or wherein component I is selected from ammonium, sodium, aluminum, calcium, cesium, chromium, copper, barium, iron, lead, lithium, magnesium, nickel, potassium, rubidium, silicon, silver, strontium, titanium, zinc, zirconium, an ammonium cation, a alkali cation, an earth alkali cation, a phosphonium cation, a sulfonium cation, or combinations thereof.

17. The developable relief precursor according to claim 1, wherein component B is a water soluble binder selected from the group comprising: a polyvinyl alcohol, a polyvinyl acetate, a partially hydrolyzed polyvinyl acetate, a functionalized polyvinyl alcohol, a functionalized polyvinyl acetate, a functionalized partially hydrolyzed polyvinyl acetate, a polyvinyl acetal, a copolymer of polyvinyl acetate and at least one other monomer, a polyvinyl acetate polymer or copolymer with at least one grafted unit or combinations thereof.

* * * * *